(12) United States Patent
Jung et al.

(10) Patent No.: US 9,147,475 B2
(45) Date of Patent: Sep. 29, 2015

(54) DATA STORAGE DEVICE COMPRISING NONVOLATILE MEMORY CHIPS AND CONTROL METHOD THEREOF

(71) Applicant: SAMSUNG ELECTRONICS CO., LTD., Suwon-si, Gyeonggi-do (KR)

(72) Inventors: Young Woo Jung, Osan-Si (KR); Heetak Shin, Hwaseong-Si (KR); Jinwoo Jung, Seoul (KR); Wan-Soo Choi, Suwon-Si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 124 days.

(21) Appl. No.: 13/945,460

(22) Filed: Jul. 18, 2013

(65) Prior Publication Data

US 2014/0022842 A1 Jan. 23, 2014

(30) Foreign Application Priority Data

Jul. 18, 2012 (KR) ........................ 10-2012-0078315

(51) Int. Cl.
*G11C 11/56* (2006.01)
*G11C 16/10* (2006.01)
(52) U.S. Cl.
CPC ............ *G11C 16/10* (2013.01); *G11C 11/5628* (2013.01); *G11C 2211/5622* (2013.01); *G11C 2211/5641* (2013.01)
(58) Field of Classification Search
CPC ....................................................... G11C 11/56
USPC ..................................................... 365/185.01
See application file for complete search history.

(56) References Cited

U.S. PATENT DOCUMENTS

| | | | |
|---|---|---|---|
| 6,751,155 B2 | 6/2004 | Gorobets | |
| 7,120,051 B2 | 10/2006 | Gorobets et al. | |
| 7,519,796 B1 | 4/2009 | Golla et al. | |
| 7,813,181 B2 | 10/2010 | Cernea | |
| 7,843,758 B2 | 11/2010 | Byeon | |
| 7,944,762 B2 | 5/2011 | Gorobets | |
| 2006/0023554 A1* | 2/2006 | Matsushita et al. | 365/230.03 |
| 2006/0190670 A1* | 8/2006 | Nakanishi et al. | 711/5 |
| 2008/0147968 A1* | 6/2008 | Lee et al. | 711/103 |
| 2008/0159012 A1* | 7/2008 | Kim | 365/189.05 |
| 2008/0192540 A1* | 8/2008 | Kong et al. | 365/185.03 |
| 2009/0172257 A1 | 7/2009 | Prins et al. | |

(Continued)

FOREIGN PATENT DOCUMENTS

| | | |
|---|---|---|
| KR | 10-2007-0101250 | 10/2007 |
| KR | 10-0843546 | 7/2008 |
| KR | 10-2011-0058028 | 6/2011 |
| KR | 10-2011-0120480 | 11/2011 |
| KR | 10-2011-0121674 | 11/2011 |

*Primary Examiner* — Min Huang
(74) *Attorney, Agent, or Firm* — F. Chau & Associates, LLC

(57) ABSTRACT

A storage device is provided which includes a plurality of memory chips each nonvolatile memory cells divided into a first memory region and a second memory region; and a memory controller configured to buffer data provided from the exterior and to control the plurality of memory chips to perform a buffer-program operation and a main-program operation. The buffered data is stored at the first memory region at the buffer-program operation and data stored at the first memory region is written at the second memory region at the main-program operation. During a main-program operation of a first memory chip among the plurality of memory chips, the memory controller buffers data to be written at a second memory chip.

20 Claims, 20 Drawing Sheets

(56) References Cited

U.S. PATENT DOCUMENTS

2010/0195388 A1* 8/2010 Jung .................. 365/185.03
2010/0325346 A1 12/2010 Huang
2011/0126066 A1 5/2011 Jo et al.
2011/0267899 A1 11/2011 Kim et al.
2013/0219109 A1 8/2013 Kim et al.

* cited by examiner

DATA STORAGE DEVICE COMPRISING NONVOLATILE MEMORY CHIPS AND CONTROL METHOD THEREOF

CROSS-REFERENCE TO RELATED APPLICATIONS

A claim for priority under 35 U.S.C. §119 is made to Korean Patent Application No. 10-2012-0078315 filed Jul. 18, 2012, in the Korean Intellectual Property Office, the entire contents of which are hereby incorporated by reference.

TECHNICAL FIELD

The inventive concepts described herein relate to a semiconductor memory device, and more particularly, relate to a storage device including nonvolatile memory chips and a control method thereof.

DISCUSSION OF THE RELATED ART

Semiconductor memory devices may be volatile or nonvolatile. Volatile semiconductor memory devices can perform read and write operations in high speed, while contents stored therein may be lost at power-off. Nonvolatile semiconductor memory devices retain contents stored therein even at power-off. Nonvolatile semiconductor memory devices may be used to store contents (data) which must be retained regardless of whether they are powered or not.

Nonvolatile semiconductor memory device types include a NAND flash memory device, a NOR flash memory device, a mask read-only memory (MROM), a programmable ROM (PROM), an erasable programmable ROM (EPROM), an electrically erasable programmable ROM (EEPROM), and the like.

A flash memory device is a type of nonvolatile semiconductor memory device. Flash memory devices are widely used as a voice and image data storing medium of information appliances such as a computer, a cellular phone, a PDA, a digital camera, a camcorder, a voice recorder, an MP3 player, a handheld PC, a game machine, a facsimile, a scanner, a printer, and the like.

As demand for a large capacity memory device increases, multi-level cells each storing multiple bits or multi-bit memory devices are becoming more common. In addition, a multi-chip package in which a plurality of memory devices is provided within a package may be generally used to provide a larger capacity.

SUMMARY OF THE INVENTIVE CONCEPT

An aspect of the inventive concept is directed to provide a storage device, comprising a plurality of memory chips each nonvolatile memory cells divided into a first memory region and a second memory region; and a memory controller configured to buffer data provided from the exterior and to control the plurality of memory chips to perform a buffer-program operation and a main-program operation, wherein the buffered data is stored at the first memory region at the buffer-program operation and data stored at the first memory region is written at the second memory region at the main-program operation, and wherein during a main-program operation of a first memory chip of the plurality of memory chips, the memory controller buffers data to be written at a second memory chip.

An aspect of the inventive concept is directed to provide a method of controlling a data storage device which includes a plurality of nonvolatile memory chips each having a buffer region managed in a single level cell manner and a main region managed in a multi-level cell manner. The method comprises storing data provided from the exterior at a buffer memory; performing a buffer-program operation in which data stored at the buffer memory is programmed at the buffer region of a first nonvolatile memory chip; and performing a main-program operation in which a plurality of pages stored at the buffer region of a second nonvolatile memory chip is programmed at the main region of the second nonvolatile memory chip, wherein the storing or the buffer-program operation is overlapped with the main-program operation.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. As used herein, the term "and/or" includes any and all combinations of one or more of the associated listed items. Also, the term "exemplary" is intended to refer to an example or illustration.

BRIEF DESCRIPTION OF THE FIGURES

The above and other features will become apparent from the following description with reference to the following figures, wherein like reference numerals refer to like parts throughout the various figures unless otherwise specified, and wherein.

DETAILED DESCRIPTION OF EXEMPLARY EMBODIMENTS

Figure 1:
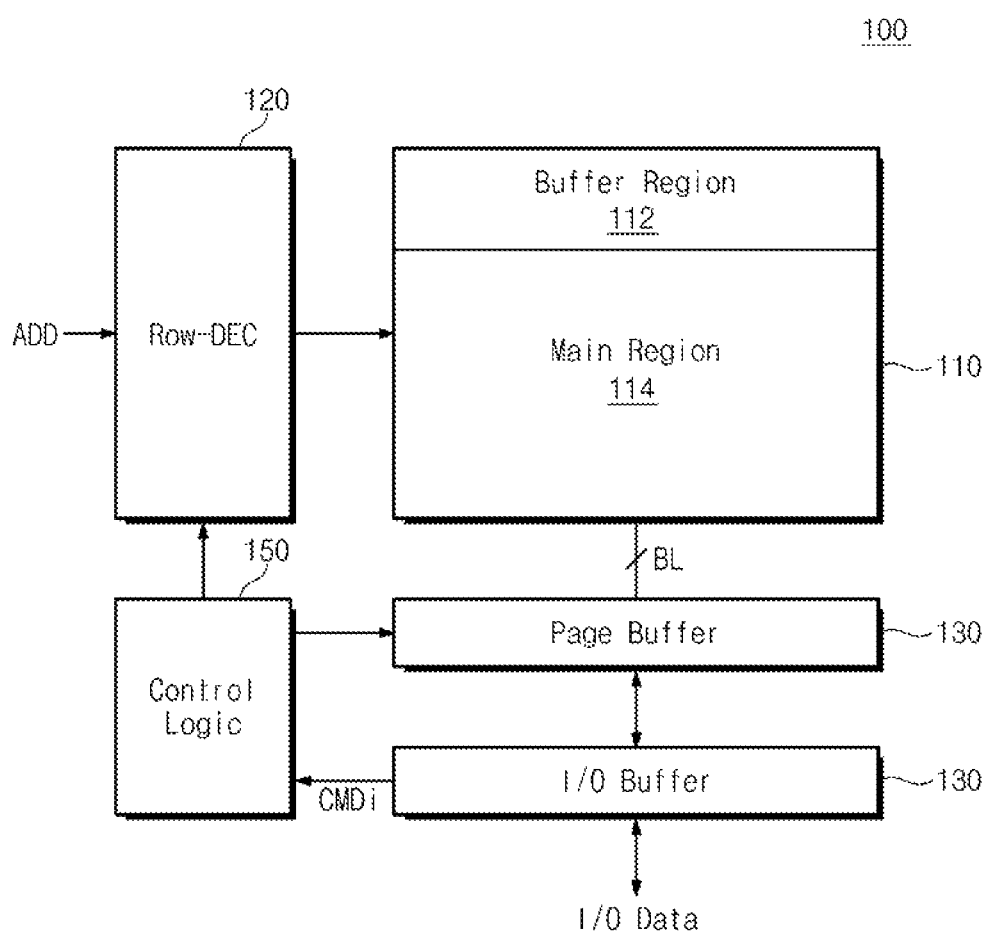
FIG. 1 is a block diagram of a nonvolatile memory device according to an embodiment of the inventive concept.

FIG. 1 is a block diagram of a nonvolatile memory device according to an embodiment of the inventive concept. Referring to FIG. 1, a memory cell array 110 of a nonvolatile memory device 100 includes a buffer region 112 and a main region 114.

The memory space of the cell array 110 may be divided into the buffer region 112 and the main region 114. The cell array 110 is connected to a row decoder 120 through word lines and selection lines. The cell array 110 is connected to a page buffer 130 through a plurality of bit lines BL. The cell array 110 includes a plurality of NAND cell strings. Data may be first written at the buffer region 112, and data stored at the buffer region 112 may then be programmed at the main region 114. An operation in which data is programmed at the buffer region 112 may be referred to as a 'buffer-program operation', and an operation in which data is programmed at the main region 114 may be referred to as a 'main-program operation'.

The main-program operation may be performed according to address information associated with data stored at the buffer region 112. In exemplary embodiments, the minimum program unit for the buffer region 112 may be variously determined depending upon a program manner, a bits-per-cell number, and so on. In accordance with an embodiment of the inventive concept, the minimum program unit for the buffer region 112 may be different from the minimum program unit for the main region 114.

Memory blocks of the cell array 110 may be divided between the buffer region 112 and the main region 114. It is well understood by persons skilled in the art that division of the buffer and main regions 112 and 114 is made logically, not physically. Division of the buffer and main regions 112 and 114 can be changed logically. Memory blocks in the buffer region 112 may be programmed in a manner different from memory blocks in the main region 114. For example, memory blocks in the buffer region 112 may be programmed according to a single-bit-per-cell program manner (hereinafter, referred to as an SLC program manner), and memory blocks in the main region 114 may be programmed according to a multi-bit-per-cell program manner (hereinafter, referred to as an MLC program manner).

In various other exemplary embodiments, memory blocks of the buffer region 112 and memory blocks of the main region 114 may both be programmed according to the MLC program manner. For example, each of memory cells in the buffer region 112 may store 2-bit data, and each of memory cells in the main region 114 may store N-bit data (N being an integer of 3 or more). Also, each memory cell in the buffer region 112 may store data bits less in number than N-bit data (N being 3 or more integer) stored in each memory cell in the main region 114.

The row decoder 120 selects any one of memory blocks of the memory cell array 110 in response to an address ADD. The row decoder 120 selects one of word lines in the selected memory block in response to the address ADD. The row decoder 120 provides word lines of the selected memory block with word line voltages. The row decoder 120 transfers selection signals to selection lines (e.g., string and ground selection lines) of the selected memory block. The row decoder 120 transfers a program voltage and a verify voltage to a selected word line and a pass voltage to an unselected word line, respectively.

The page buffer 130 may operate as a write driver or a sense amplifier according to its current mode of operation. During a program operation, the page buffer 130 provides a bit line of the cell array 110 with a bit line voltage corresponding to data to be programmed. During a read operation, the page buffer 130 senses data stored in a selected memory cell via a bit line. The page buffer 130 latches the sensed data to output it to an external device through an input/output buffer 140.

The input/output buffer 140 transfers write data input at a program operation to the page buffer 130. The input/output buffer 140 outputs read data provided from the page buffer 130 to the external device during a read operation. The input/output buffer 140 may transfer an input command or address to control logic 150 or the row decoder 120.

The control logic 150 controls the page buffer 130 in response to the command CMDi and the address ADD transferred from the input/output buffer 140. The control logic 150 controls an access to a selected memory region in response to a write/read/erase command provided through the input/output buffer 140.

The nonvolatile memory device 100 according to an embodiment of the inventive concept may be configured such that data initially stored at the buffer region 112 is later programmed at the main region 114. This sequence of program operations may be referred to as On-chip Buffered Programming (OBP).

Figure 2:
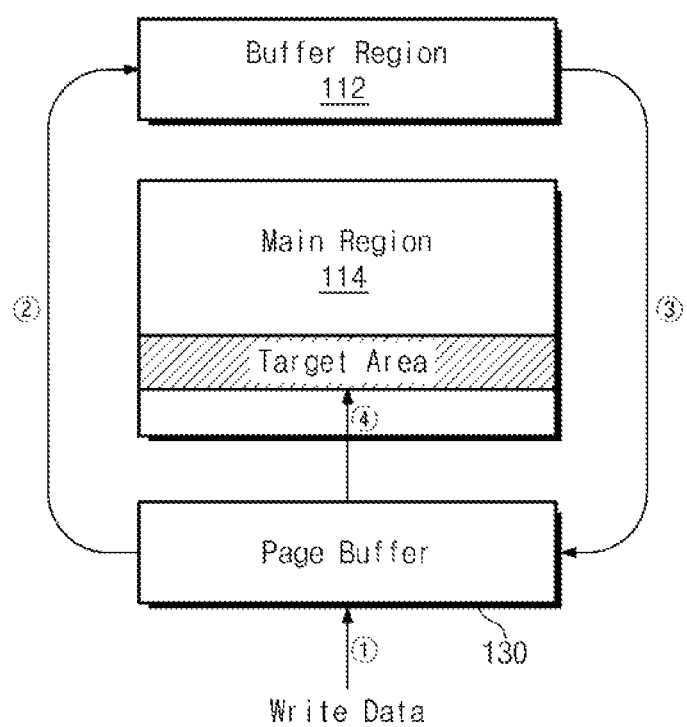
FIG. 2 is a block diagram illustrating on-chip buffered programming according to an embodiment of the inventive concept.

FIG. 2 is a block diagram illustrating on-chip buffered programming (OBP) according to an embodiment of the inventive concept. Referring to FIG. 2, a nonvolatile memory device 100 programs write data provided from an external device at a buffer region 112, and program data programmed at the buffer region 112 at a main region 114. Herein, a program operation in the buffer region 112 may be referred to as a buffer-program operation, and a program operation in the main region 114 may be referred to as a main-program operation.

Memory cells of the buffer region 112 may be operated as single level cells. Thus, memory cells of the buffer region 112 store 1-bit data so that the write speed of the buffer region 112 is more rapid than that of the main region 114 formed of multi-level cells. This may mean that the speed of the buffer-program operation on the buffer region 112 is rapider than that of the main-program operation on the main region 114. Data integrity of the buffer region 112 may be higher than that of the main region 114. Write data may be received from an external device, and the input write data may be rapidly loaded onto a page buffer 130. This is depicted by the data path (①) in FIG. 2.

During the buffer-program operation, write data stored at the page buffer 130 is programmed at the buffer region 112. If page data (e.g., 2K-byte data) is loaded onto the page buffer 130, the page buffer 130 programs the loaded page data at the buffer region 112. The page data may be programmed at the buffer region 112 according to an SLC program manner. This is depicted by a data path (②) in FIG. 2.

A read operation on the buffer region 112 may be performed to program data (corresponding to a plurality of pages) stored at the buffer region 112 to a target area of the main region 114. This is depicted by a data path (③) in FIG. 2. A plurality of pages of data stored at the buffer region 112 may be sensed by the page buffer 130. The sensed pages of data may be stored and retained through a plurality of latches (not shown) in the page buffer 130. A read operation on the buffer region 112 may be controlled by an external command of the nonvolatile memory device 100.

If a read operation on the buffer region 112 is completed, the nonvolatile memory device 100 may be provided with a write command indicating programming at the main region 114 of the read pages of data. The write command may include a target address corresponding to the target area in the main region 114. The page buffer 130 may program a plurality of pages of data at the target area in the main region 114 according to the MLC program manner. For example, the plurality of pages of data read from the buffer region 112 may be programmed at the same time. This is depicted by a data path (④) in FIG. 2.

There is described herein an example in which the buffer region 112 is managed according to the SLC program manner. However, the inventive concept is not limited thereto. For example, the inventive concept is applicable to nonvolatile memory devices in which a bits-per-cell number of the buffer region 112 is less than that of the main region 114. In various other exemplary embodiments, the inventive concept is applicable to nonvolatile memory devices in which the buffer region 112 is implemented with a volatile (e.g., RAM, FIFO-RAM) memory having single-hit memory cells, while the main region 114 is implemented with non-volatile memory programmed in a multi-bit (MLC) manner.

The main-program operation is executed according to address information associated with data stored at the buffer region 112. In exemplary embodiments, the minimum program unit for the buffer region 112 and the minimum program unit for the main region 114 may be variously determined depending upon the MLC/SLC program manner, a bits-per-cell number, and so on. In accordance with an embodiment of the inventive concept, the minimum program unit for the buffer region 112 may be different from the minimum program unit for the main region 114.

Figure 3:
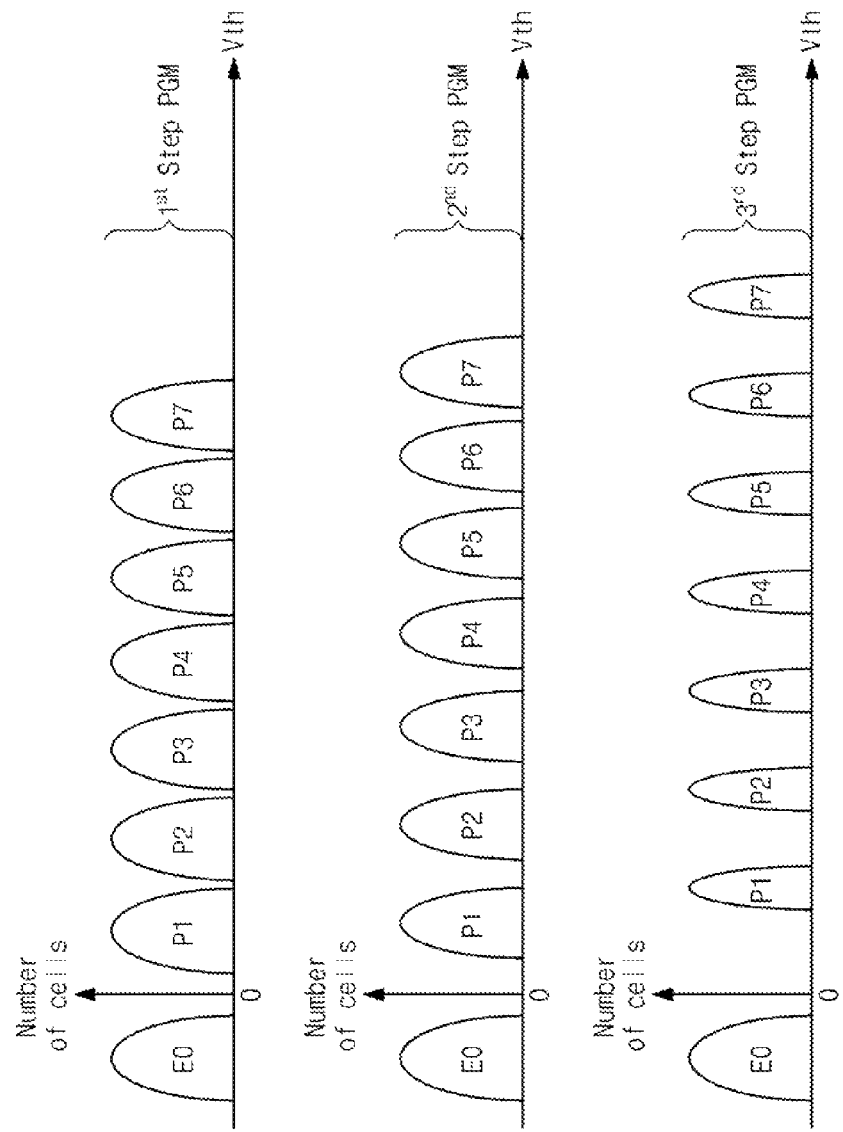
FIG. 3 is a memory cell threshold voltage distribution graph illustrating a program method of the main region in FIG. 2.

FIG. 3 is a memory cell threshold voltage distribution graph illustrating a program method of the main region in FIG. 2. Referring to FIG. 3, there is illustrated the variations in threshold voltage distributions when three pages (i.e., three bits) of data are programmed at a main region 114 through 3rd-step programming. Herein, there is exemplarily described an 8-8-8 programming manner in which 3-bit data is programmed at each of first to third step program operations.

At the 1st-step programming, three pages (i.e., three bits) of data are stored at memory cells connected to a selected word line. Each of the memory cells has a threshold voltage corresponding to one of eight states E0, P1, P2, P3, P4, P5, P6, and P7. Threshold voltage distributions of memory cells formed by the 1st-step programming may be relatively wide. The threshold voltage distributions of memory cells formed by the 1st-step programming may become wider by influence of adjacent memory cells.

When the 2nd-step programming and 3rd-step programming are performed the threshold voltage distributions of the memory cells become narrower. Program verify voltages used at the 2nd-step programming are higher than program verify voltages used at the 3rd-step programming. Also, the program methods for gathering threshold voltage distributions may be applied to the 2nd-step programming and 3rd-step programming.

The threshold voltage distribution corresponding to each state is narrowed by controlling the program verification voltage and the program voltage. The threshold voltage distribution corresponding to each state is further narrowed by increasing the program verification voltage or by widening the width of a program voltage pulse. However, such techniques may cause an increase in the time required to program memory cells. Thus, the time taken to perform the 2nd-step programming may be longer than the time taken to perform the 1st-step programming. Likewise, the time taken to perform the 3rd-step programming may be longer than the time taken to perform the 2nd-step programming.

Each of the 1st-step, 2nd-step, and 3rd-step programming may include reading a plurality of pages of data from the buffer region 112 and programming the plurality of pages of data at the current target area. The nonvolatile memory device 100 is not accessible during the 1st-step, 2nd-step, and 3rd-step programming. Thus, the nonvolatile memory device 100 may be at a busy state during the 1st-step, 2nd-step, and 3rd-step programming. In a multi-chip package including a plurality of nonvolatile memory chips, to reduce the period of time when all nonvolatile memory devices are at the busy state may be directly linked with improvement of the performance of a storage device.

Figure 4:
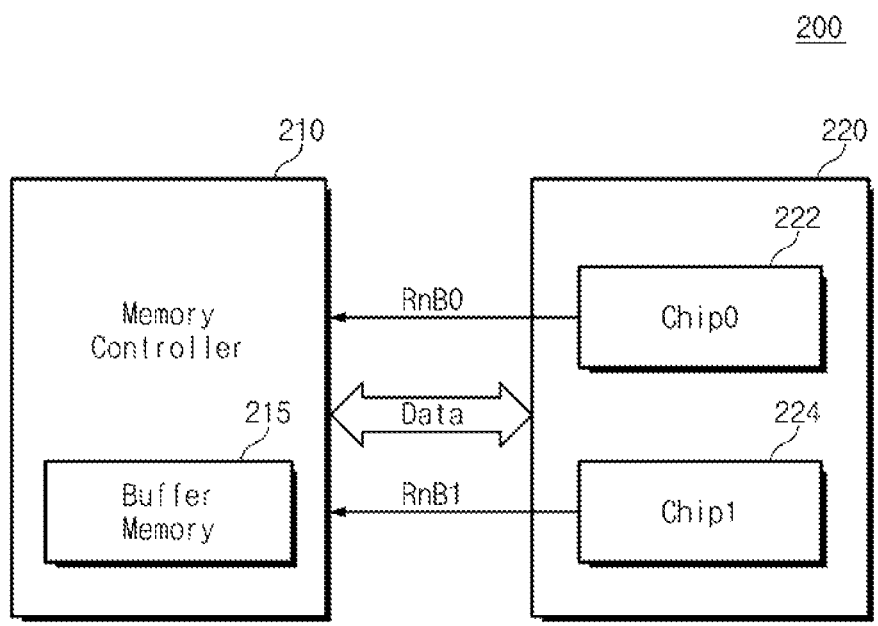
FIG. 4 is a block diagram schematically illustrating a storage device according to an embodiment of the inventive concept.

FIG. 4 is a block diagram of a storage device according to an exemplary embodiment of the inventive concept. Referring to FIG. 4, a storage device 200 includes a memory controller 210 and a nonvolatile memory device 220.

The memory controller 210 is configured to control the nonvolatile memory device 220 in response to a request of a host. In response to a write request of the host, the memory controller 210 provides the nonvolatile memory device 220 with a write command, an address, and data. If data (e.g., page data) of the minimum program unit on a buffer region (not shown) of the nonvolatile memory device 220 is stored at a RAM buffer memory 215, for example, the memory controller 210 may control the nonvolatile memory device 220 to store data of the minimum program unit at the buffer region.

A buffer-program operation may be performed according to address information. If data of the minimum program unit on a main region (not shown) of the nonvolatile memory device 220 is stored at the buffer region, for example, the memory controller 210 may control the nonvolatile memory device 220 to store data of the minimum program unit at the main region. It is possible to minimize the size of the buffer memory 215 of the memory controller 210 by storing data at the buffer region through the buffer-program operation and storing data at the main region through a main-program operation. In other words, data for the main-program operation (1st-step to 3rd-step programming) above described need not be retained at the buffer memory 215. For this reason, it is possible to minimize a size of the buffer memory 215.

The nonvolatile memory device 220 includes a plurality of memory chips 222 and 224. Each of the memory chips 222 and 224 may be configured the same or substantially the same as a nonvolatile memory device 100 described in FIG. 1. Each of the memory chips 222 and 224 may be managed according to a manner in which data is stored at the buffer and main regions through sequential buffer and main-program operations. Each of the memory chips 222 and 224 outputs a status signal indicating when it is accessible. For example, the memory chip 222 outputs a status signal RnB0 and the memory chip 224 outputs a status signal RnB1. In the case that any one of the status signals RnB0 and RnB1 indicates a ready status, the nonvolatile memory device 220 may be accessed. On the other hand, in the case that both the status signals RnB0 and RnB1 indicate a busy status, the nonvolatile memory device 220 may not be accessed.

If the host requests a write operation on sequential data, the memory controller 210 may store input data at the buffer memory 215. The memory controller 210 programs data stored at the buffer memory 215 at a buffer region of a memory chip having a ready status. The memory controller 210 controls the nonvolatile memory device 220 such that the period of time that the memory chips 222 and 224 are busy is minimized. For example, the memory controller 210 may control the nonvolatile memory device 220 such that one chip performs 3rd-step programming while the other chip performs 1st-step or 2nd-step programming. In this case, it is possible to minimize the period of time when the memory chips 222 and 224 are all busy. Thus, when sequential data is written, it is possible to minimize the period of time when buffering of the buffer memory 215 is impossible.

The nonvolatile memory device 220 and the memory controller 210 may constitute a memory card, a solid state drive (SSD), a memory stick, and so on. The nonvolatile memory device 220 may include a plurality of memory blocks, each of which includes a plurality of memory cells arranged in rows and columns. Each memory cell may store multi-level (or, multi-bit) data. The memory cells may be arranged to have a two-dimensional array structure or a three-dimensional (or, vertical) array structure.

Figure 5A:
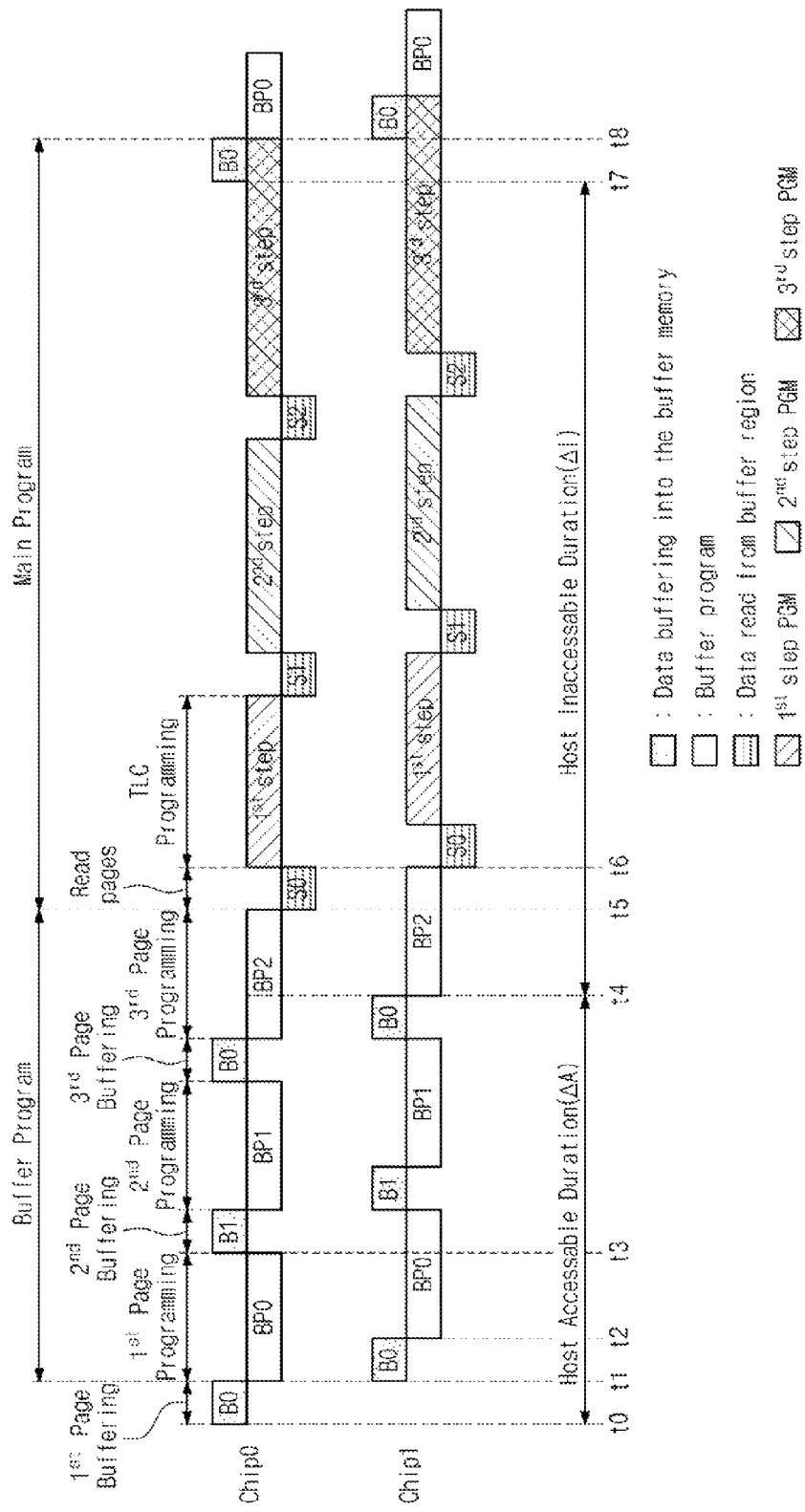
FIGS. 5A and 5B are timing diagrams illustrating an operation of the storage device of FIG. 4.
Figure 5B:
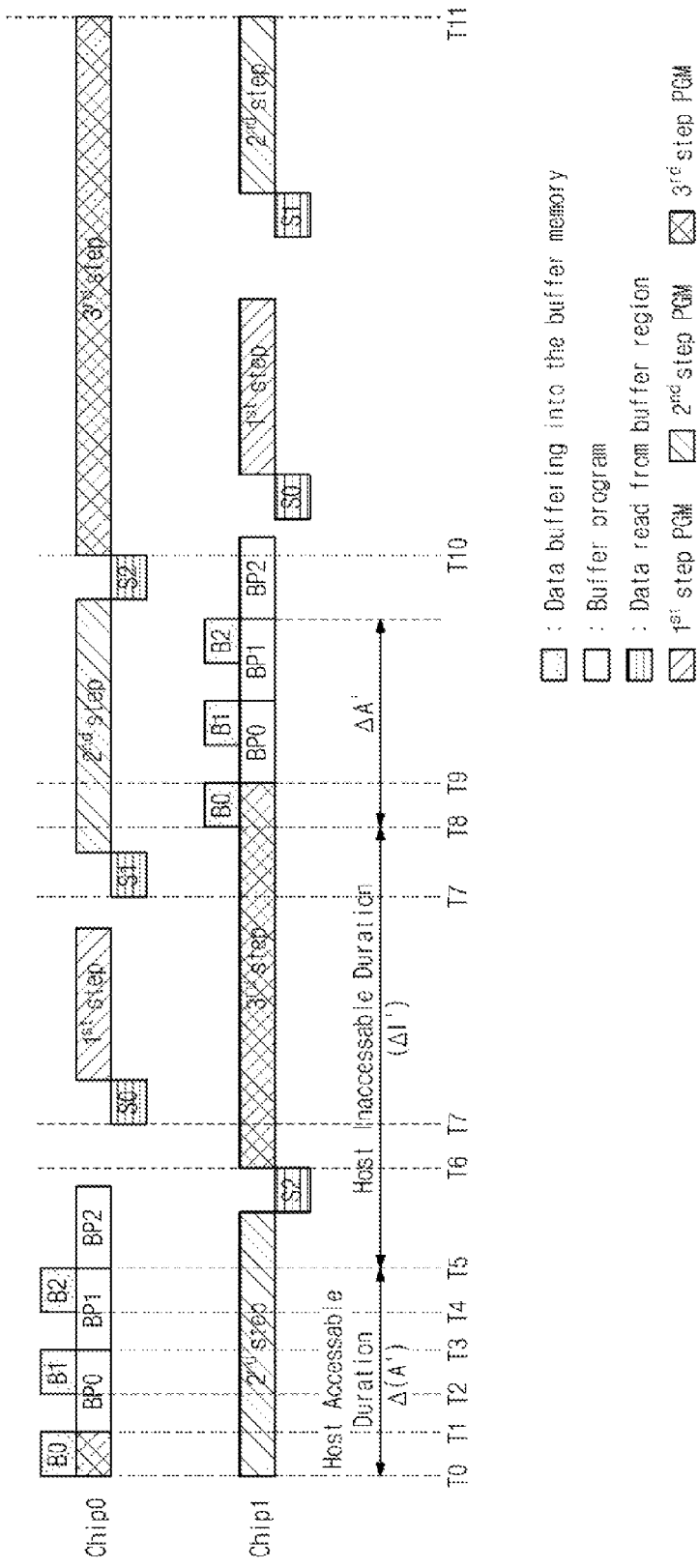

FIGS. 5A and 5B are timing diagrams illustrating an operation of the storage device of FIG. 4. FIG. 5A illustrates an example in which each of memory chips 222 and 224 continuously performs a buffer-program operation and a main-program Operation. FIG. 5B, illustrates an example in which when one memory chip performs a main-program operation necessitating the longest time the other memory chip performs a main-program operation necessitating the shortest time.

Referring to FIG. 5A, buffer and main-program operations on a memory chip Chip0 may be continuously performed. If buffer programming BP0 on a first page of the memory chip Chip0 commences, buffer and main-program operations on a memory chip Chip1 may also be performed. With this pipeline programming manner, each memory chip may continuously perform the buffer and main-program operations without an idle time. This will be more fully described below.

At time t0, a first page to be written at the memory chip Chip0 is stored at a (RAM) buffer memory 215. In FIG. 5A, "B0" indicates a transfer of data to the buffer memory 215. At time t1 when the transfer of data to the buffer memory 215 has ended, there a buffer-program operation in which the first page is stored at a buffer region of the memory chip Chip0. In FIG. 5A, "BP0" indicates the buffer-program operation of the first page. The buffer-program operation expressed by "BP0" may include a plurality of transactions for commands, addresses, and data transmission between the memory controller 210 and the memory chip Chip0. This will be more fully described later.

At time t3, a second page to be written at the memory chip Chip0 is stored at the buffer memory 215. In FIG. 5A, "B1" indicates a transfer of data to the buffer memory 215. Continuously, there may be performed a buffer-program operation in which the second page is stored at the buffer region of the memory chip Chip0. In FIG. 5, "BP1" indicates the buffer-program operation of the second page. A third page to be written at the memory chip Chip0 is stored at the buffer memory 215. In FIG. 5A, "B2" indicates a transfer of data to the buffer memory 215. Continuously, there may be performed a buffer-program operation in which the third page is stored at the buffer region of the memory chip Chip0. In FIG. 5, "BP2" indicates the buffer-program operation of the third page. It is assumed that the buffer-program operation on the third page is ended at time t5.

At time t5 when buffer-program operations on three pages have ended, a main-program operation of the memory chip Chip0 may be performed (commenced). Three pages of data stored at the buffer region may be read for the main-program operation. The read may be expressed by "S0" in FIG. 5A. The three pages of data read may be retained by latches of the page buffer 130 without being output to an external device. Herein, there is described an example in which three pages of data are read. However, the inventive concept is not limited thereto. For example, two pages of data can be read from the buffer region.

At time t6 when a read operation on the buffer region is ended, the memory chip Chip0 may perform 1st-step programming. At the 1st-step programming, the three pages of data stored at the latches of the page buffer 130 are programmed at one wordline through a 3-bit MLC (e.g., three layer cell (TCL)) program manner. In FIG. 5A, "$1^{st}$ step" indicates the 1st-step programming. As described above, 2nd-step and 3rd-step programming may be sequentially performed at the memory chip Chip0. Programming on the memory chip Chip0 has ended at time t8.

At time t1 when the buffer-program operation of the memory chip Chip0 commences, a first page for a buffer-program operation of the memory chip Chip1 may be stored at the buffer memory 215. In FIG. 5A, "B0" indicates an input of data to the buffer memory 215. At time t2 when a transfer of data to the buffer memory 215 has ended, there may be performed (commenced) a buffer-program operation in which the first page is stored at a buffer region of the memory chip Chip1. In FIG. 5A, "BP0" indicates the buffer-program operation on the first page. Buffer and main-program operations on the memory chip Chip1 may be performed the same or substantially the same as the buffer and main-program operations of the memory chip Chip0, and a redundant description thereof is thus omitted. The memory chips Chip0 and Chip1 may be programmed according to a pipeline manner.

With the above description, the memory chips Chip0 and Chip1 may be externally accessible during the time period from t0 to t4. On the other hand, during the time period from t4 to t7, the memory chips Chip0 and Chip1 may perform program operations. Thus, during the time period from t4 to t7, the memory chips Chip0 and Chip1 may enter a 'busy' status in which they are not externally accessed. As two memory chips Chip0 and Chip1 are programmed in a pipeline manner, the time period in which the memory chips Chip0 and Chip1 are not externally accessed may be relatively long.

In FIG. 5B, there is illustrated an example in which when one memory chip performs a main-program operation necessitating the longest time the other memory chip performs a main-program operation necessitating the shortest time and an intermediate time.

At time T0, a first page to be written at the memory chip Chip0 is stored at the buffer memory 215. In FIG. 5B, "B0" indicates a transfer of data to the buffer memory 215. At time t1 when the transfer of data to the buffer memory 215 is ended, a buffer-program operation in which the first page is stored at a buffer region of the memory chip Chip0 may be performed (commenced). In FIG. 5B, "BP0" indicates the buffer-program operation on the first page. The buffer-program operation expressed by "BP0" may include a plurality of transactions for commands, addresses, and data transmission between the memory controller 210 and the memory chip Chip0. At this time, it is assumed that the memory chip Chip1 performs 2nd-step programming of a main-program operation.

At time T2 when the buffer-program operation on the first page is being performed, a second page to be written at the memory chip Chip0 may be transferred to the buffer memory 215 from a host. While the memory chip Chip1 performs 2nd-step programming, data exchange between the memory chip Chip0 and the memory controller 210 is possible. While the memory chip Chip0 performs the buffer-program operation, an access to the buffer memory 215 may be made by the host. Thus, a second page may be buffered during the buffer-program operation of the first page, and a third page may be buffered during the buffer-program operation of the second page. The time taken for buffering and buffer programming may be shorter compared with the case in FIG. 5A in which data on the memory chips Chip0 and Chip1 are buffered in immediate succession.

At time T6 when buffering and buffer programming on the memory chip Chip0 are ended, 3rd-step programming on the memory chip Chip1 may commence. Thus, for the 3rd-step programming, the memory controller 210 may provide a read command on a plurality of pages of data stored at the buffer region of the memory chip Chip1 before time T6. The memory chip Chip1 may read and latch the plurality of pages of data from the buffer region in response to the read command. A command sequence may be provided from the memory controller 210 to perform the 3rd-step programming of the main region 114, which is expressed by "S2" in FIG. 5B. Following the 3rd-step programming "S2", the memory chip Chip1 may program the plurality of pages of data latched by the page buffer 130 at a target area of the main region 114 according to the 3rd-step programming sequence.

During the 3rd-step programming S2 of the main region 114 of the memory chip Chip1, the memory controller 210 may control the memory chip Chip0 to perform 1st-step programming S0 of the main region 114 of the memory chip Chip0. A transaction between the memory controller 210 and the memory chip Chip0 generated for the 1st-step programming of the memory chip Chip0 is expressed by "S0" in FIG. 5B. Following "S0", the 1st-step programming on the memory chip Chip0 is performed.

During the 3rd-step programming S2 of the main region 114 of the memory chip Chip1, the memory controller 210 may control the memory chip Chip0 to perform 2nd-step programming S1 of the main region 114 of memory chip Chip0. A transaction between the memory controller 210 and the memory chip Chip0 generated for the 2nd-step programming of the memory chip Chip0 is expressed by "S1" in FIG. 5B. Following "S1", the 2nd-step programming on the memory chip Chip0 may be performed. The 2nd-step programming of the main region 114 of the memory chip Chip0 may be continued after the 3rd-step programming of the memory chip Chip1 is completed.

Before T9 when the 3rd-step programming of the main region 114 of the memory chip Chip1 is completed, the memory controller 210 may buffer data provided from the host. There may be repeated a buffering-buffer-program operation in which sequentially buffered data is programmed at a buffer region of the memory chip Chip1. Thus, a second page may be buffered during buffer programming of the first page. In FIG. 5B, "B1" indicates buffering of the second page and "BP0" indicates buffer programming of the first page. A third page may be buffered during the buffer programming of the second page. In FIG. 5B, "B2" indicates buffering of the third page and "BP1" indicates buffer programming of the second page.

With the above description, while one of the memory chips Chip0 and Chip1 performs 3rd-step programming, the other performs a part of 1st-step and 2nd-step programming, and vice versa. Thus, it is possible to reduce the time period in which the memory chips Chip0 and Chip1 all are busy. This may mean that there is reduced a host inaccessible time duration ΔI' during which it is impossible to transfer data to a storage device 200 from the host.

Figure 6A:
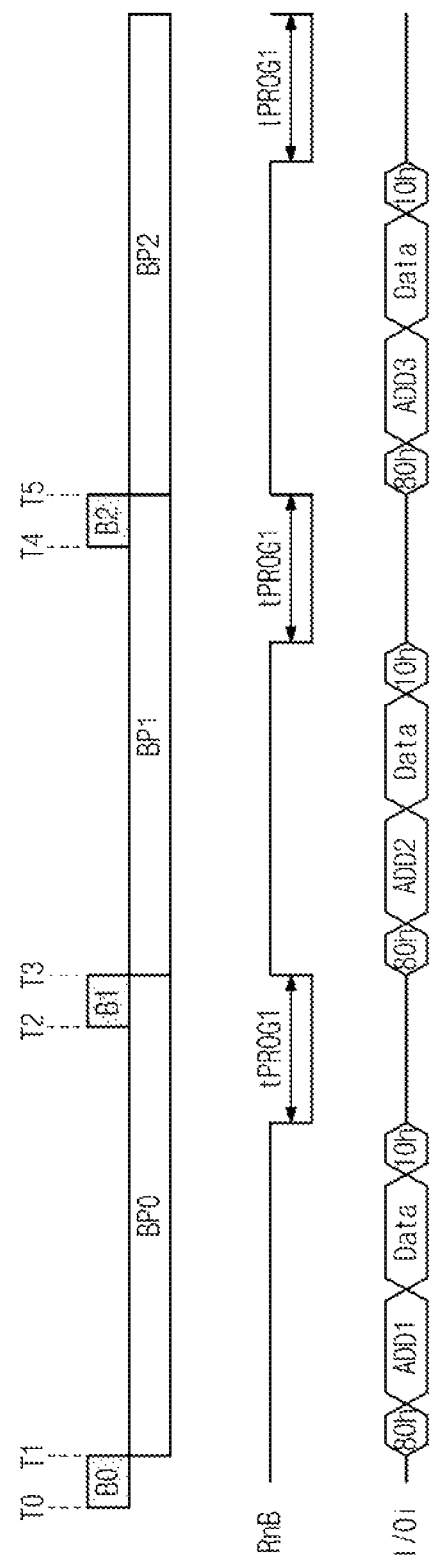
FIGS. 6A and 6B are timing diagrams illustrating operations of a memory controller and a memory chip during the host accessible duration and the host inaccessible duration in FIG. 5B.
Figure 6B:
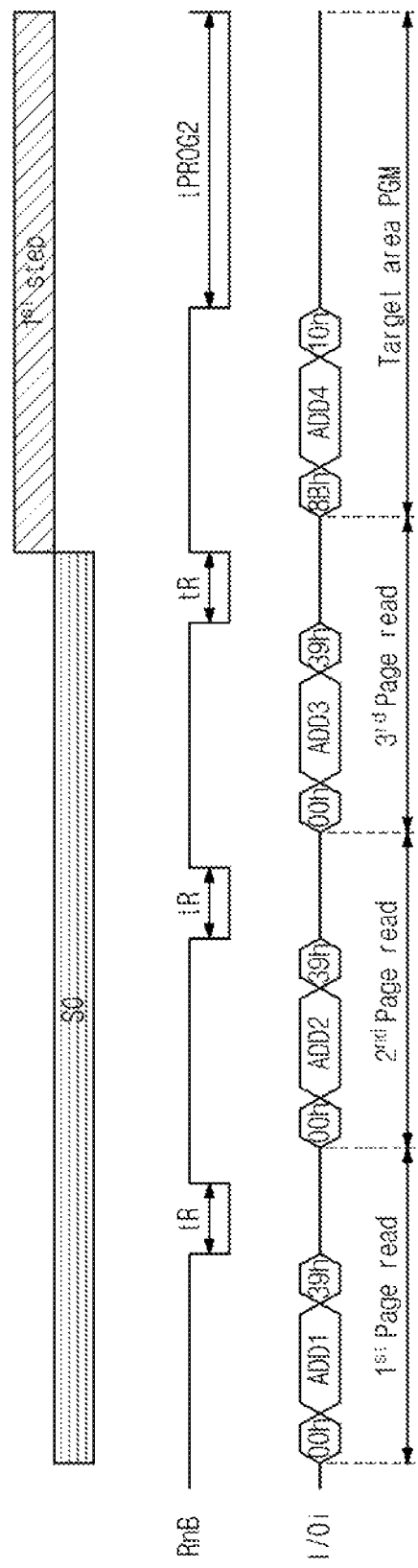

FIGS. 6A and 6B are timing diagrams illustrating operations of a memory controller 210 and a memory chip Chip0 during the host accessible duration and the host inaccessible duration in FIG. 5B. FIG. 6A illustrates a command sequence provided from a memory controller 210 and a status signal of a memory chip Chip0. FIG. 6B illustrates a host inaccessible duration, including an overall command sequence for 1st-step programming and a status signal of the memory chip Chip0.

Referring to FIG. 6A, at a host accessible time duration ΔA' (see FIG. 5B), operations of the memory controller 210 and the memory chip Chip0 may commence. At time T0, a first page to be written at the memory chip Chip0 is transferred to a random access memory (RAM) buffer memory 215 of the memory controller 210 from a host. In FIG. 6A, "B0" indicates a transfer of data to the buffer memory 215. At time T1 when a transfer of data to the buffer memory 215 is ended, there may be performed a buffer-program operation in which the first page is stored at a buffer region of the memory chip Chip0. In FIG. 6A, "BP0" indicates the buffer-program operation on the first page.

For the buffer-program operation of the first page expressed by "BP0", a write command 80h, an address ADD1, and the first page of data may be transferred to the memory chip Chip0 from the memory controller 210. Then, the first page may be programmed at the buffer region of the memory chip Chip0 in response to a confirm command 10h (tPROG1). While the write command 80h, the address ADD1, and the first page of data are transferred to the memory chip Chip0 from the memory controller 210, the memory chip Chip0 may output a ready status (RnB being high). The memory chip Chip0 may output a busy state (RnB being low) during the buffer-program operation.

At time T2 when the first page is being buffer programmed, a second page to be written at the memory chip Chip0 may be transferred to the buffer memory 215 of the memory controller 210 from the host. In FIG. 6A, "B1" indicates a transfer of data to the buffer memory 215. At time T3 when a transfer of data to the buffer memory 215 has ended, there can be performed a buffer-program operation in which the second page is stored at a buffer region of the memory chip Chip0. In FIG. 6A, "BP1" indicates the buffer-program operation on the second page.

For the buffer-program operation of the second page expressed by "BP1", a write command 80h, an address ADD2, and the second page of data may be transferred to the memory chip Chip0 from the memory controller 210. Then, the second page may be programmed at the buffer region of the memory chip Chip0 in response to a confirm command 10h (tPROG1). While the write command 80h, the address ADD2, and the second page of data are transferred to the memory chip Chip0 from the memory controller 210, the memory chip Chip0 may output a ready status (RnB being high). The memory chip Chip0 may output a busy state (RnB being low) during the buffer-program operation.

At time T4 when the first page is being buffer programmed, a third page to be written at the memory chip Chip0 may be transferred to the buffer memory 215 of the memory controller 210 from the host. In FIG. 6A, "B2" indicates a transfer of data to the buffer memory 215. At time T5 when a transfer of data to the buffer memory 215 is ended, there may be performed a buffer-program operation in which the third page is stored at a buffer region of the memory chip Chip0. In FIG. 6A, "BP2" indicates the buffer-program operation on the third page.

For the buffer-program operation of the second page expressed by "BP2", a write command 80h, an address ADD3, and the third page of data may be transferred to the memory chip Chip0 from the memory controller 210. Then, the third page is buffer programmed at the buffer region of the memory chip Chip0 in response to a confirm command 10h (tPROG1). While the write command 80h, the address ADD3, and the second page of data are transferred to the memory chip Chip0 from the memory controller 210, the memory chip Chip0 may output a ready status (RnB being high). The memory chip Chip0 may output a busy state (RnB being low) during the buffer-program operation.

FIG. 6B illustrates a host inaccessible duration, including an overall command sequence for 1st-step programming and a status signal of the memory chip Chip0. Referring to FIG. 6B, illustrated is a procedure in which three pages are read and the read pages are programmed at a target region.

First, three pages stored at a buffer region may be sequentially read. A buffer region command may be provided three times. The buffer read commands may be provided with respect to a plurality of pages stored at a buffer region of a memory chip Chip0, respectively. Herein, data read from the buffer region need not be output to the exterior of the memory chip Chip0. Although not shown in FIG. 6B, internal read commands DAh and DFh can be provided at the start and end points of time of a buffer read operation, respectively. If an output of data stored at the buffer region is required for error correction or before it is written at a target area, the internal read commands DAh and DFh may be skipped.

A code DAh indicating the start of an internal buffer-read operation may be received, and a command 00h, an address ADDR1, and a command 39h may be sequentially received to read a first page from the buffer region. In this case, a page buffer 130 of the memory chip Chip0 may sense and latch the first page from the buffer region during a read time tR. During the read time tR, a status signal RnB of the memory chip may indicate a busy status (i.e., a logical low level).

When the internal buffer-read operation on the first page has ended, the status signal RnB of the memory chip Chip0 may be set to a ready status (i.e., a logical high level). In this case, a memory controller 210 generates a command sequence (00h-ADDR2-39h) for buffer-reading a second page from the buffer region. In this case, the page buffer 130 of the memory chip Chip0 may sense and latch the second page from the buffer region during a read time tR. During the read time tR, the status signal RnB of the memory chip may indicate a busy status (i.e., a logical low level).

When the internal buffer-read operation on the second page has ended, the status signal RnB of the memory chip Chip0 may be set to a ready status (i.e., a logical high level). In this case, the memory controller 210 generates a command sequence (00h-ADDR3-39h) for reading a third page from the buffer region. In this case, the page buffer 130 of the memory chip Chip0 may sense and latch the third page from the buffer region during a read time tR. During the read time tR, the status signal RnB of the memory chip may indicate a busy status (i.e., a logical low level).

When the internal buffer-read operation on the third page has ended, the status signal RnB of the memory chip Chip0 may be set to a ready status (i.e., a logical high level). The memory controller 210 provides the memory chip Chip0 with a command DFh indicating an end of the internal buffer-read operation and provides a command sequence (8Bh-ADDR4-10h) indicating a main-program operation. During a program execution period tPROG2, the status signal RnB of the memory chip Chip0 may be set to a busy status and pages of data stored at the page buffer 130 may be programmed a target area.

FIG. 6B illustrates 1st-step programming of the main-program operation. 2nd-step programming of the main-program operation may be performed in the same manner as a command sequence illustrated in FIG. 6B, except that a program execution period of the 2nd-step programming is longer than the program execution period of the 1st-step programming. Likewise, 3rd-step programming of the main-program operation may be performed in the same manner as a command sequence illustrated in FIG. 6B, except that a program execution period of the 3rd-step programming is longer than the program execution period of the 2nd-step programming.

Figure 7:
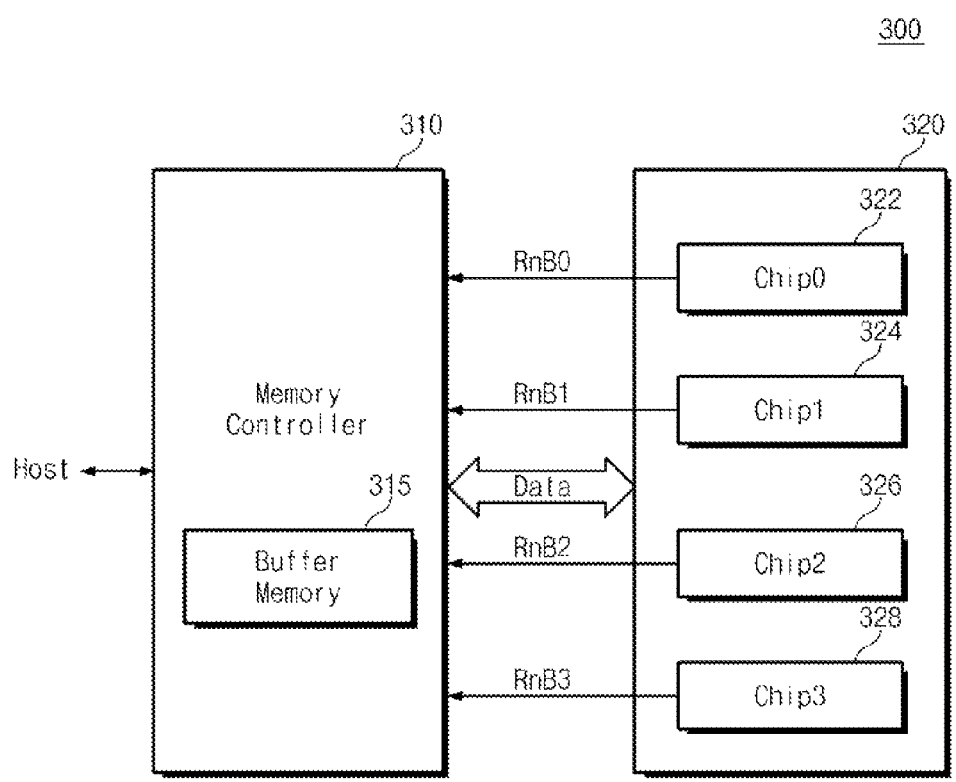
FIG. 7 is a block diagram of a storage device according to an embodiment of the inventive concept.

FIG. 7 is a block diagram of a storage device according to an embodiment of the inventive concept. Referring to FIG. 7, a storage device 300 includes a memory controller 310 and a nonvolatile memory device 320.

The memory controller 310 may be configured to control the nonvolatile memory device 320 in response to a request of a host (not shown). In response to a write request of the host, the memory controller 310 provides the nonvolatile memory device 320 with a write command, an address, and data. If data (e.g., page data) of the minimum program unit on a buffer region (not shown) of the nonvolatile memory device 320 is stored at a buffer memory 315, for example, the memory controller 310 controls the nonvolatile memory device 320 to store data of the minimum program unit at the buffer region.

The nonvolatile memory device 320 includes a plurality of memory chips 322, 324, 326, and 328. Each of the memory chips 322, 324, 326, and 328 may be configured the same or substantially the same as a nonvolatile memory device 100 described in FIG. 1. Each of the memory chips 322, 324, 326, and 328 may be configured such that data is stored at the buffer and main regions through the respective buffer and main-program operations. Each of the memory chips 322, 324, 326, and 328 may output a status signal indicating that it is accessible. For example, the memory chip 322, 324, 326, and 328 may output status signals RnB0, RnB1, RnB2, and RnB3, respectively.

In the case that any one of the status signals RnB0, RnB1, RnB2, and RnB3 indicates a ready status, the nonvolatile memory device 320 may be accessed. On the other hand, in the case that the status signals RnB0, RnB1, RnB2, and RnB3 all indicate a busy status, the nonvolatile memory device 320 can not be accessed. In this latter case, data buffered by the buffer memory 315 can not be written at the nonvolatile memory device 320.

If the host requests a write operation on sequential data, the memory controller 310 may store input data at the buffer memory 315. The memory controller 310 programs data stored at the buffer memory 315 at a buffer region of a memory chip having a ready status. The memory controller 310, however, may control the nonvolatile memory device 320 such that one chip performs 3rd-step programming while the other chip performs 1st-step or 2nd-step programming. While one chip performs 3rd-step programming, a buffer-program operation may be performed under the control of the memory controller 310 to store data stored at the buffer memory 315 at the other chip.

When a memory chip performs 3rd-step programming necessitating the longest program time, a buffer-program operation of at least another memory chip may be performed. Thus, during the 3rd-step programming of one memory chip, data buffering of the buffer memory 315 and a buffer-program operation on another memory chip may be performed. If memory chips perform 3rd-step programming in a pipeline manner, the host inaccessible duration may be minimized.

Figure 8A:
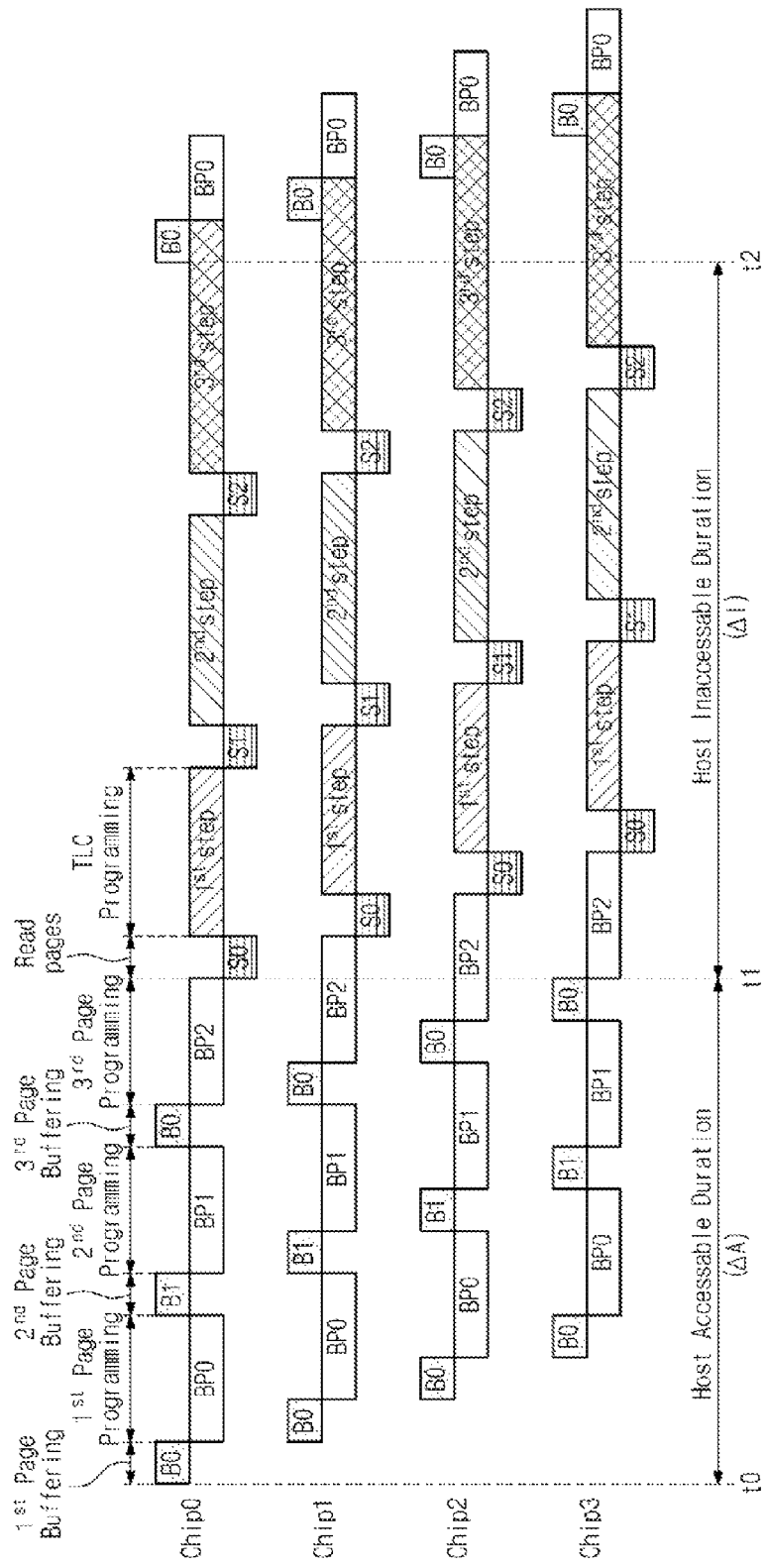
FIGS. 8A and 8B are timing diagrams illustrating an operation of the storage device of FIG. 7.
Figure 8B:
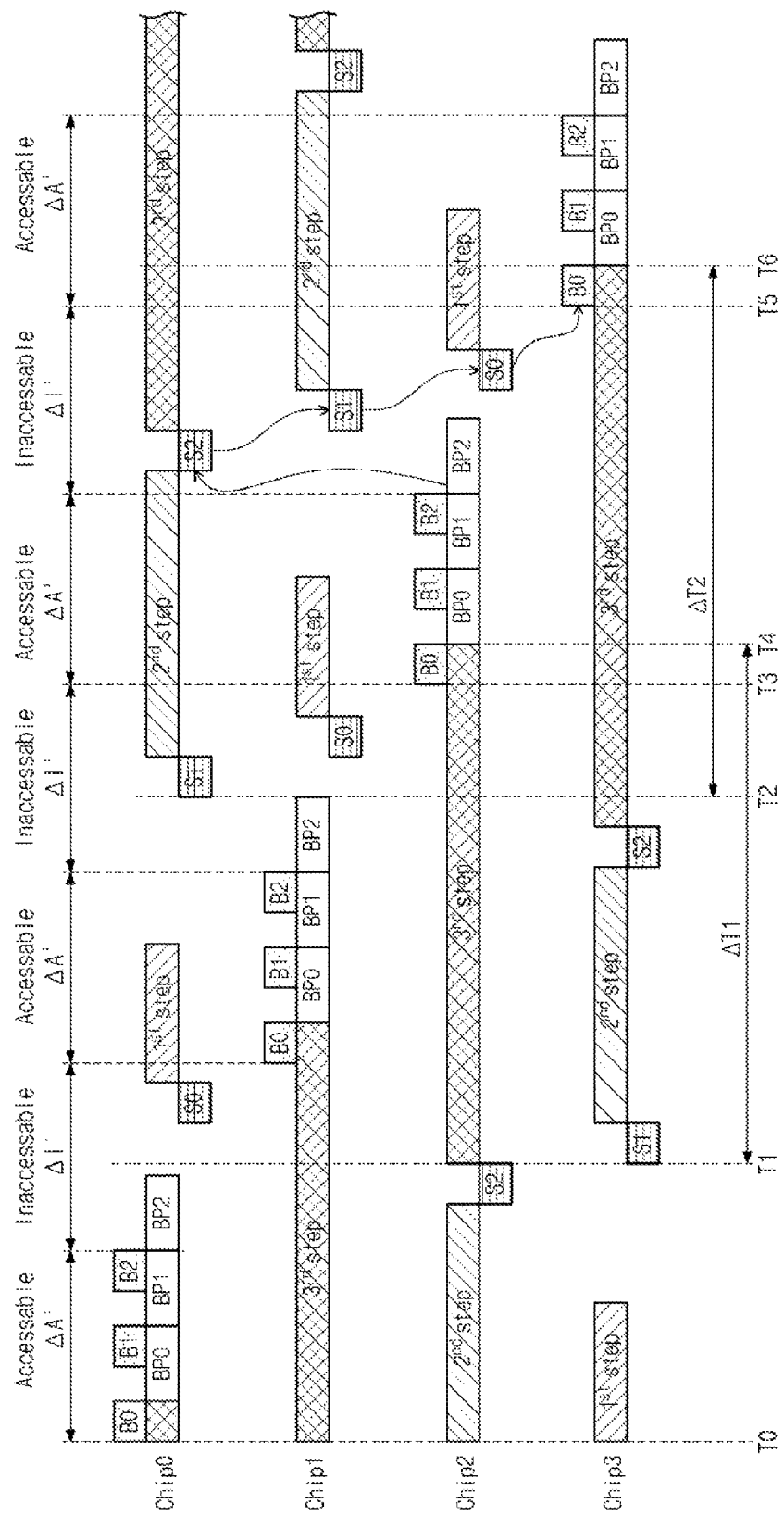

FIGS. 8A and 8B are timing diagrams illustrating an operation of the storage device of FIG. 7. FIG. 8A, illustrates an example in which each of four memory chips continuously performs a buffer-program operation and a main-program operation. FIG. 8B illustrates an example in which when one memory chip performs a main-program operation necessitating the longest time and the other three memory chip performs buffering and a buffer-program operation.

Referring to FIG. 8A, a buffer-program operation and a main-program operation on each of memory chips Chip0, Chip1, Chip2, and Chip3 may be performed in a pipeline manner. With this pipeline program manner, the memory chips Chip0, Chip1, Chip2, and Chip3 continuously perform a buffer-program operation and a main-program operation without an idle time. This will be more fully described below.

At time T0, a first page to be written at the memory chip Chip0 may be stored at a buffer memory 315. In FIG. 8A, "B0" indicates a transfer of data to the buffer memory 315. While a buffer-program operation BP0 in which the first page stored at the buffer memory 315 is programmed at a buffer region of the memory chip Chip0, a first page to be written at the memory chip Chip1 can be stored/buffered at the buffer memory 315. If there is performed a buffer-program operation BP0 in which the first page stored at the buffer memory 315 is programmed at a buffer region of the memory chip Chip2, a first page to be written at the memory chip Chip2 may be stored/buffered at the buffer memory 315. While a buffer-program operation BP0 in which the first page stored at the buffer memory 315 is programmed at a buffer region of the memory chip Chip3, a first page to be written at the memory chip Chip3 may be stored/buffered at the buffer memory 315.

In each of the memory chips Chip0, Chip1, Chip2, and Chip3, first to third pages may be processed through buffering B0, B1, and B2 and buffer programming BP0, BP1, and BP2 executed in a pipeline manner. A time period from to when buffering commences to t1 when buffering of a third page to be stored at the memory chip Chip3 is ended may be a host accessible duration. Thus, during the host accessible duration ΔA, data stored at the buffer memory 315 may be instantly programmed at one of memory chips. During the host accessible duration ΔA, the host may access a storage device 300.

After three pages are programmed at a buffer region of each of the memory chips Chip0, Chip1, Chip2, and Chip3, main-program operations on the memory chips Chip0, Chip1, Chip2, and Chip3 may be performed in a pipeline manner. At a main-program operation, each of the memory chips Chip0, Chip1, Chip2, and Chip3 may internally buffer-read three pages from its buffer region. These internally buffer-reads may be expressed by "S0" in FIG. 8A. The three pages read may be latched and retained by a page buffer without an output to the exterior of each of the memory chips Chip0, Chip1, Chip2, and Chip3. Here is described an embodiment in which three pages are read. However, the inventive concept is not limited thereto. For example, two pages can be read from a buffer region.

All of the memory chips Chip0, Chip1, Chip2, and Chip3 may be busy from time t1 when the main-program operation commences to time t2 when buffering of the memory chip Chip0 commences. Alternatively, although a chip having a ready status between times t1 and t2 exists, a memory chip capable of receiving data may not exist. Thus, data buffering of the buffer memory 315 may be impossible between times t1 and t2. Thus, a period between time t1 when a main-program operation of a memory chip is started and t2 time when the main-program operation is nearly ended and buffering is capable being performed may correspond to a host inaccessible duration ΔI.

In FIG. 8B, there is illustrated an example in which when one memory chip performs the longest program step of a main-program operation and another memory chip performs buffering and a buffer-program operation on a plurality of pages of data.

At time T0, a plurality of pages of data to be written at a memory chip Chip0 are buffered in a buffer memory 315 and the buffered data may be programmed at a buffer region of the memory chip Chip0 at the same time. This may be expressed by "B0", "B1", and "B2" in FIG. 8B. The time duration in which buffering and buffer programming on one memory chip (e.g., Chip0) are performed may include a time duration in which another memory chip (e.g., Chip1) performs the longest program step (e.g., 3rd-step programming) of a main-program operation.

3rd-step programming of a memory chip Chip2 may commence at time T1. A memory chip Chip3 may be controlled to perform 2nd-step programming of a main-program operation at a time duration ΔT1 (spanning times T1 to T3) in which the 3rd-step programming of the memory chip Chip2 is performed. The memory chip Chip3 may be controlled to perform a part of 3rd-step programming following the 2nd-step programming of the main-program operation.

Together with the start of the 2nd-step programming of the memory chip Chip3, there be started a buffer read step S0 for 1st-step programming of the main-program operation on the memory chip Chip0. The 1st-step programming of the main-program operation may be started following the buffer read operation S0 of the memory chip Chip0. Following the 1st-step programming of the memory chip Chip0, buffering B0 and buffer programming BP0 may commence just before the 3rd-step programming of the memory chip Chip1 is ended. Continuously, buffering and buffer programming on the memory chip Chip1 may be repeated until time T2. Further, a buffer read operation S0 for a main-program operation of the memory chip Chip1 and a part of 1st-step programming may be executed.

Operations of memory chips Chip0, Chip1, and Chip3 may be checked during a time duration T1 (T1 to T3) in which 3rd-step programming of the memory chip Chip2 is performed. Operations of memory chips Chip0, Chip1, and Chip2 to be performed during the duration T1 (T1 to T3) in which 3rd-step programming of the memory chip Chip3 is performed may be described the same manner as described above.

Together with a start of the 3rd-step programming of the memory chip Chip3, the memory chip Chip2 may be controlled to sequentially perform a buffer read operation S1, 2nd-step programming, a buffer read operation S2, and a part of 3rd-step programming. When a buffer read operation S1 of the memory chip Chip0 is completed, the memory chip Chip1 may be controlled to perform a buffer read operation S0 and 1st-step programming. Buffering B0, B1, and B2 and buffer programming BP0, BP1, and BP2 may be performed in turn with respect to the memory chip Chip2.

When one memory chip performs 3rd-step programming, other memory chips may perform a buffering-buffer-program cycle or 1st-step or 2nd-step programming. Thus, it is possible to minimize a host inaccessible duration $\Delta I'$ during which it is impossible for a host to access a storage device.

Figure 9:
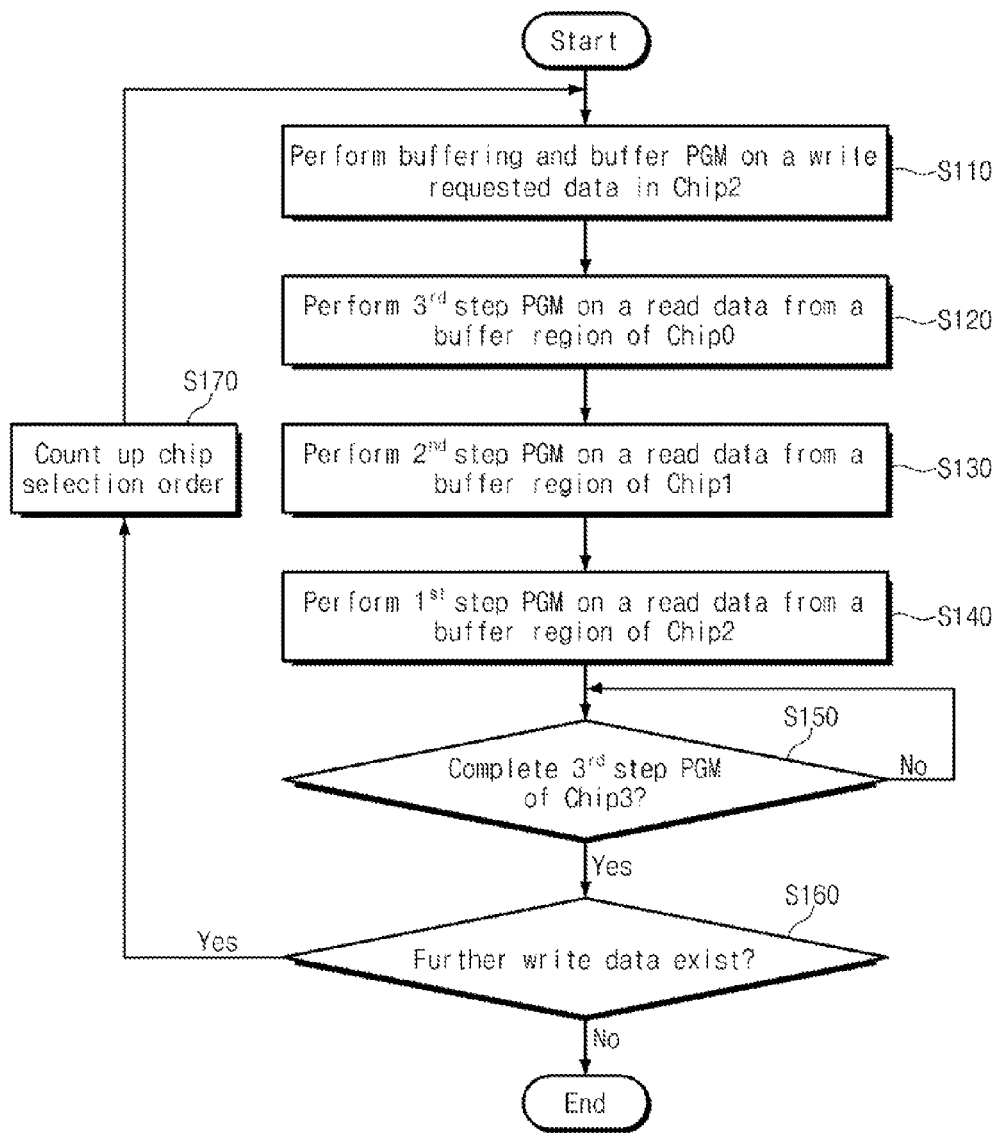
FIG. 9 is a flow chart of a program method of a nonvolatile memory device according to an embodiment of the inventive concept.

FIG. 9 is a flow chart of a program method of a nonvolatile memory device according to an embodiment of the inventive concept. FIG. 9 illustrates a pipeline program method on memory chips when one memory chip (e.g., Chip3) performs 3rd-step programming. Below, a pipeline program operation will be described with reference to FIGS. 7 and 8B. Also, a control operation of a memory controller 310 will be described using a time duration T2 to T6 of FIG. 8B in which 3rd-step programming of the memory chip Chip3 is performed. Chips may be selected in the following order of Chip2, Chip0, Chip1, Chip2, and Chip3 under the assumption that there is finally selected the memory chip Chip3 which performs 3rd-step programming.

In step S110, a memory controller 310 buffers a first page provided from a host during B0 for a buffer-program operation of the memory chip Chip2. Buffering may be commenced at time T3. If the buffering is ended, the memory controller 310 may program the first page stored at a buffer memory 315 in a buffer region of the memory chip Chip2. The buffer-program operation may be started from T4. Buffering and buffer programming of the memory chip Chip2 are performed in a pipeline manner at B1 and BP1 periods on a second page and at B2 and BP2 on a third page.

In step S120, after a buffer-program command is sent to the memory chip Chip2 or when a buffer-program operation has been performed, the memory controller 310 may select the memory chip Chip0. The memory chip Chip0 is controlled such that a plurality of pages is read from a buffer region of the memory chip Chip0 and stored at a page buffer of the memory chip Chip0. This operation is expressed by "S2" in FIG. 8B. A command is provided to the memory chip Chip0 such that the plurality of pages read from the buffer region is programmed at a main region of the memory chip Chip0. For example, the memory controller 310 controls the memory chip Chip0 to perform 3rd-step programming of a main-program operation. If a program execution command indicating 3rd-step programming is provided to the memory chip Chip0, the memory chip Chip0 may perform the 3rd-step programming.

In step S130, the memory controller 310 selects the memory chip Chip1 immediately after a program execution command for 3rd-step programming is provided to the memory chip Chip0. The memory chip Chip1 is controlled such that a plurality of pages is read from a buffer region of the memory chip Chip1 and stored at the page buffer. This operation is expressed by "S1" in FIG. 8B. The memory controller 310 provides a command for 2nd-step programming of the main-program operation such that the plurality of pages read from the buffer region is programmed at a target area of the memory chip Chip1. If a program execution command indicating 2nd-step programming is provided to the memory chip Chip1, the memory chip Chip1 performs the 2nd-step programming.

In step S140, the memory controller 310 selects the memory chip Chip2 immediately after a program execution command for 2nd-step programming is provided to the memory chip Chip1. The memory chip Chip2 is controlled such that a plurality of pages is read from a buffer region of the memory chip Chip2 and stored at the page buffer of memory chip Chip2. This operation is expressed by "S0" in FIG. 8B. The memory controller 310 provides a command for 1st-step programming of the main-program operation of the memory chip Chip2 such that the plurality of pages read from the buffer region is programmed at the target area of the memory chip Chip2. If a program execution command indicating 1st-step programming is provided to the memory chip Chip2, the memory chip Chip2 performs the 1st-step programming.

In decision step S150, the memory controller 310 determines whether 3rd-step programming of the memory chip Chip3 has ended. If 3rd-step programming of the memory chip Chip3 is determined to have ended, the method proceeds to decision step S160. If 3rd-step programming of the memory chip Chip3 is determined not to have ended, the decision step S150 is repeated until 3rd-step programming of the memory chip Chip3 has ended.

In decision step S160, the memory controller 310 determines whether write requested data provided from the host exists. If no write requested data provided from the host exists or if a program end command is provided from the host, the method is ended. If write requested data provided from the host exists, the method proceeds to step S170.

In step S170, the memory controller 310 sequentially counts up to index the memory chips selected for operations S110 to S160. For example, a memory chip Chip3 3rd-step programming of which is ended may be selected as a target of a buffer-program operation on a plurality of pages of data buffered. Memory chips selected at previous steps S110 to S150 are shift-selected to be selected for the next operation among S110 to S150, respectively. Afterwards, the method proceeds to step S110. For example, after chip shifting-selection performed by step S170, in the next loop, Chip3 is at step S110, Chip1 is at step S120, Chip2 is at step S130, Chip3 is at step S140.

A host inaccessible duration $\Delta I'$ is reduced by selecting memory chips for every step as described using the flow chart in FIG. 9. Thus, when one memory chip performs 3rd-step programming of a main-program operation corresponding to the longest busy status, pipeline programming may be scheduled such that buffering and buffer programming on at least another memory chip are performed. Thus, the host accessible duration becomes longer.

Figure 10:
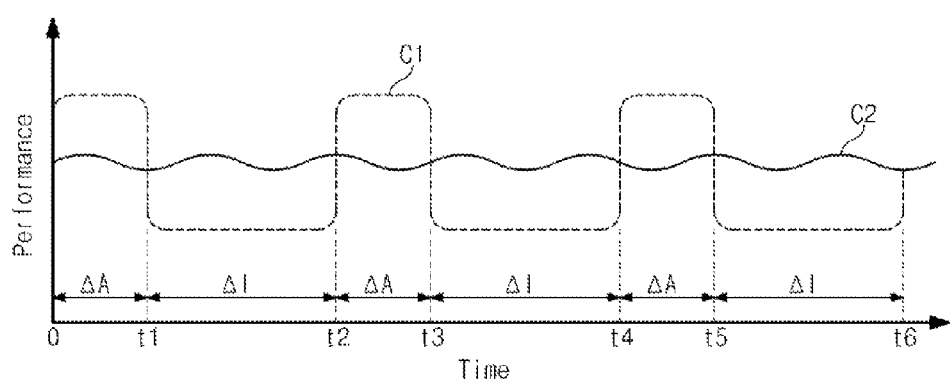
FIG. 10 is a graph illustrating an effect of performance improvement according to the embodiment illustrated in FIGS. 8A and 8B.

FIG. 10 is a graph illustrating an effect of performance improvement according to practice of an exemplary embodiments illustrated in FIGS. 8A and 8B. Referring to FIG. 10, "C1" indicates an access-performance curve when a pipeline program method in FIG. 8A is applied to a storage device according to an embodiment of the inventive concept, and "C2" indicates an access-performance curve when a pipeline program method in FIG. 8B is applied to the storage device.

Referring to the performance curve C1, a host accessible duration $\Delta A$ and a host inaccessible duration $\Delta I$ are contrasted. During the host accessible duration $\Delta A$, each memory chip performs buffering and buffer programming in a pipeline manner. On the other hand, during the host inaccessible duration $\Delta 1$, 1st-step to 3rd-step programming of a main-program operation on memory chips is performed. The performance is improved by writing data provided from an external device freely at a buffer memory 315 during the host accessible duration ΔA. On the other hand, since it is impossible to write data provided from an external device at the buffer memory 315 during the host inaccessible duration ΔI, the performance is lowered. The performance may be largely varied when there is used a pipeline program manner in FIG. 8A in which a main-program operation is continuously (repeatedly) performed, and the host inaccessible duration ΔI may become longer.

Referring to the performance curve C2 corresponding to a pipeline manner in FIG. 8B, memory chips are scheduled such that at least one memory chip is accessed at 3rd-step programming of a main-program operation executed at each memory chip. Thus, the host inaccessible duration ΔI is reduced, and the performance is improved.

Figure 11:
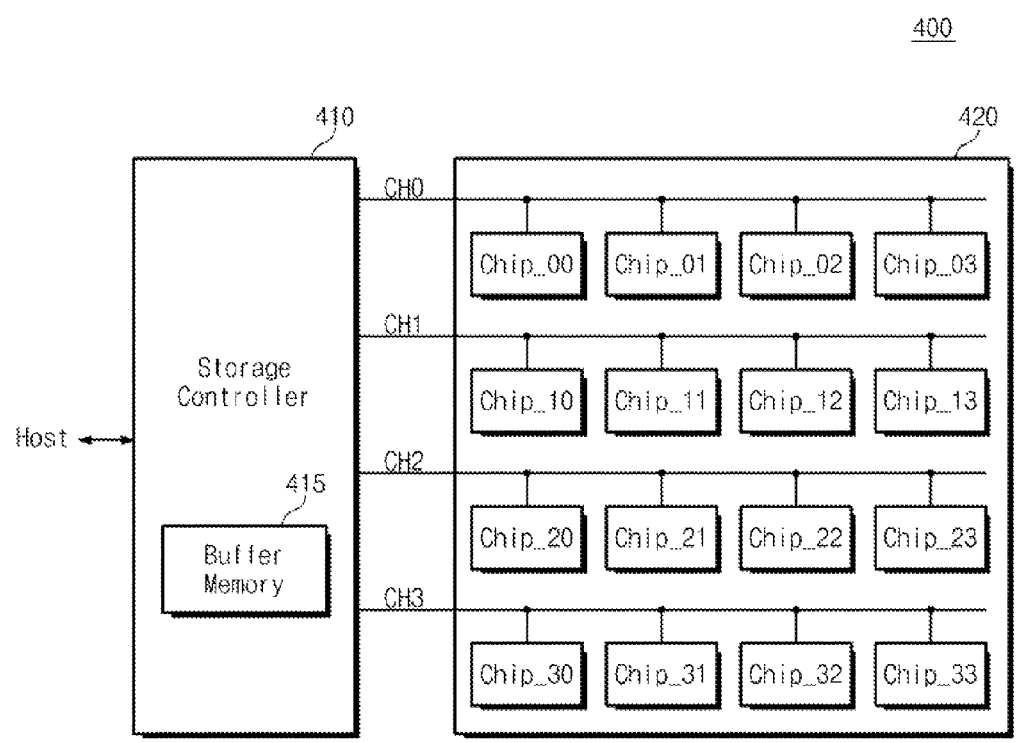
FIG. 11 is a block diagram of a storage device according to an embodiment of the inventive concept.

FIG. 11 is a block diagram of a storage device according to an embodiment of the inventive concept. Referring to FIG. 11, a storage device 400 includes a storage controller 410 and a nonvolatile memory device 420. The nonvolatile memory device 420 may be formed of a multi-chip package which exchanges data through a plurality of channels CH0 to CH3.

Input/output ports (e.g., 8-bit I/O ports) of memory chips Chip_00 to Chip_03 may be connected to a first channel CH0. The remaining channels CH1 to CH3 may be connected to multiple chips in the same manner as the first channel CH0.

When data is programmed at the nonvolatile memory device 420, the storage controller 410 selects memory chips by the channel or by the 'way'. Herein, the 'way' may be formed of memory cells simultaneously selected at four different channels. The storage controller 410 may apply a pipeline program method in FIG. 8A or 8B with respect to each of the channels CH0 to CH3. High access performance may be expected by providing a buffer memory 415 corresponding to four or more channels and applying pipeline programming with respect to each of channels.

Figure 12:
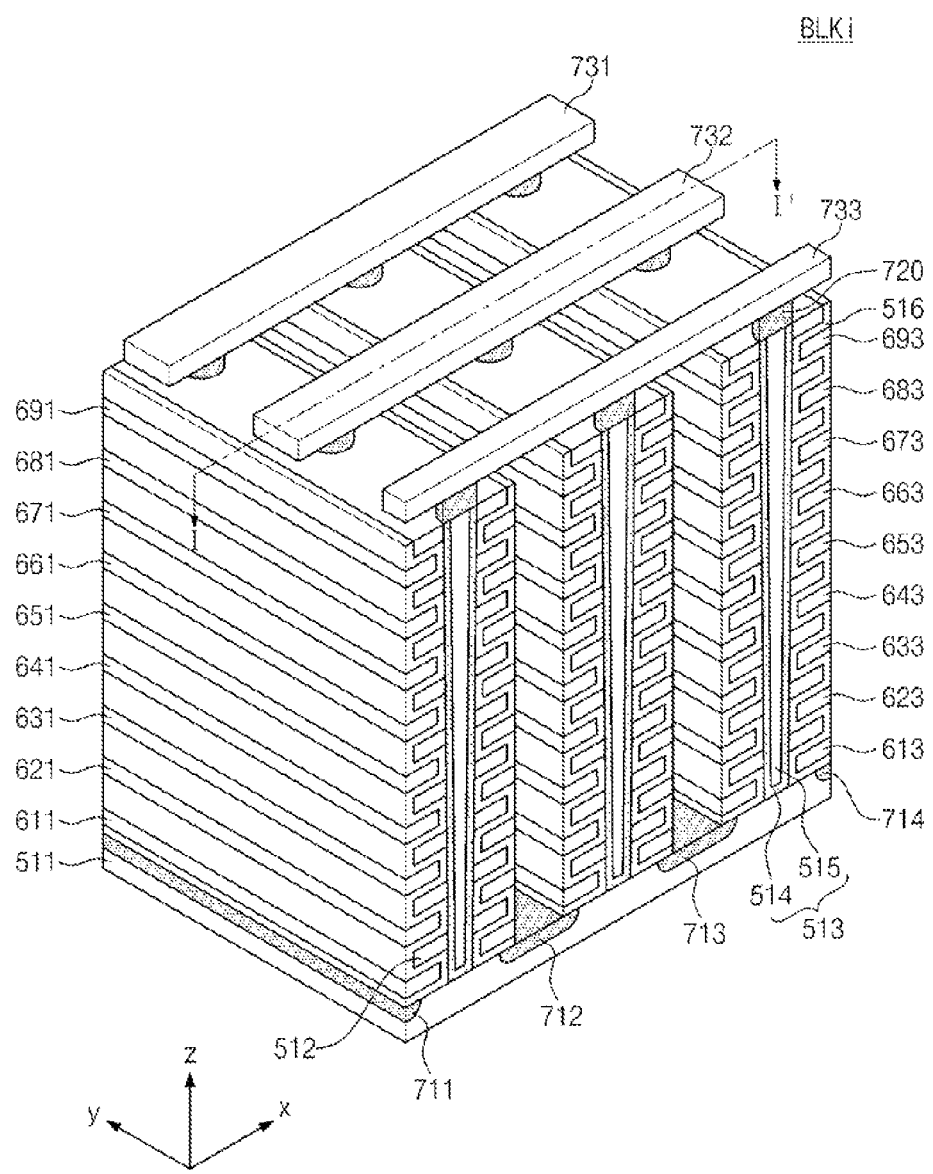
FIG. 12 is a perspective view illustrating one of the memory blocks in a memory cell array in FIG. 1.

FIG. 12 is a perspective view illustrating one of the memory blocks in the memory cell array in FIG. 1. Referring to FIG. 12, a memory block BLKi includes structures extending along first to third directions x, y, and z.

A substrate 511 may be provided to form the memory block BLKi. The substrate 511 may be a well of a first conductive type. The substrate 511 may be formed of a p-well in which boron is injected, for example. Alternatively, the substrate 511 may be a pocket p-well provided within an n-well. Below, it is assumed that the substrate 511 is a p-well. However, the substrate 511 is not limited to a p-well.

A plurality of highly doped doping regions 711, 712, 713, and 714 extending along the first direction y may be provided in the substrate 511. For example, the plurality of doping regions 711 to 714 may be formed to be spaced apart from one another along the third direction x. The doping regions 711 to 714 may be n-type. Below, it is assumed that doping regions 711 to 714 are n-type. However, the doping regions 711 to 714 are not limited to the n-type.

On the substrate 511 between two adjacent doping regions of the doping regions 711 to 714, a plurality of insulation materials 512 extending along the z-direction may be provided sequentially on the substrate 511. The insulation materials 512 may be formed to be spaced apart along the z-direction. For example, the insulation materials may include an insulation material such as silicon oxide.

On the substrate 511 between two adjacent doping regions among the doping regions 711 to 714, a plurality of pillars are arranged sequentially along the y-direction so as to penetrate the plurality of insulation materials 512 along the z-direction. For example, the pillars may contact with the substrate 511 through the insulation materials 512.

Each of channels films 514 may include a first type of silicon material. For example, the channel film 514 of each pillar may include a silicon material having the same type as the substrate 511. Below, it is assumed that the channel film 514 of each pillar includes p-type silicon. However, the channel film 514 of each pillar is not limited to the p-type silicon. For example, the channel film 514 of each pillar may include non-conductive intrinsic semiconductor.

An information storage film provided on an upper surface of an insulation material, placed at the uppermost layer, from among the insulation materials 512 may be removed. In exemplary embodiments, an information storage film provided at a lateral surface, opposite to pillars, from among lateral surfaces of the insulation materials 512 can be removed.

Drains 720 may be provided on the pillars, respectively. The drains 720 may be second-type silicon materials. For example, the drains 720 may be n-type silicon materials. Below, it is assumed that the drains 720 include n-type silicon materials. However, the drains 720 are not limited to include n-type silicon materials. In exemplary embodiments, the drains 720 may be extended toward tops of channel films 514 of the pillars.

Bit lines 731 to 733 extending along the x-direction are provided on the drains 320, respectively. The bit lines 731 to 733 are spaced apart from one another along the y-direction. The bit lines 731 to 733 are connected with corresponding drains 720, respectively. For example, the drains 720 and the bit lines 731 to 733 are connected via contact plugs, respectively. Each of the bit lines 731 to 733 may be a metallic conductive material. In preferred embodiments, each of the bit lines 731 to 733 is a non-metallic conductive material such as polysilicon.

Each of the pillars with an adjacent information storage film 516 and adjacent conductive materials may constitute a NAND cell string. Thus, the pillars constitute NAND cell strings with adjacent information storage films 516 and adjacent conductive materials.

Figure 13:
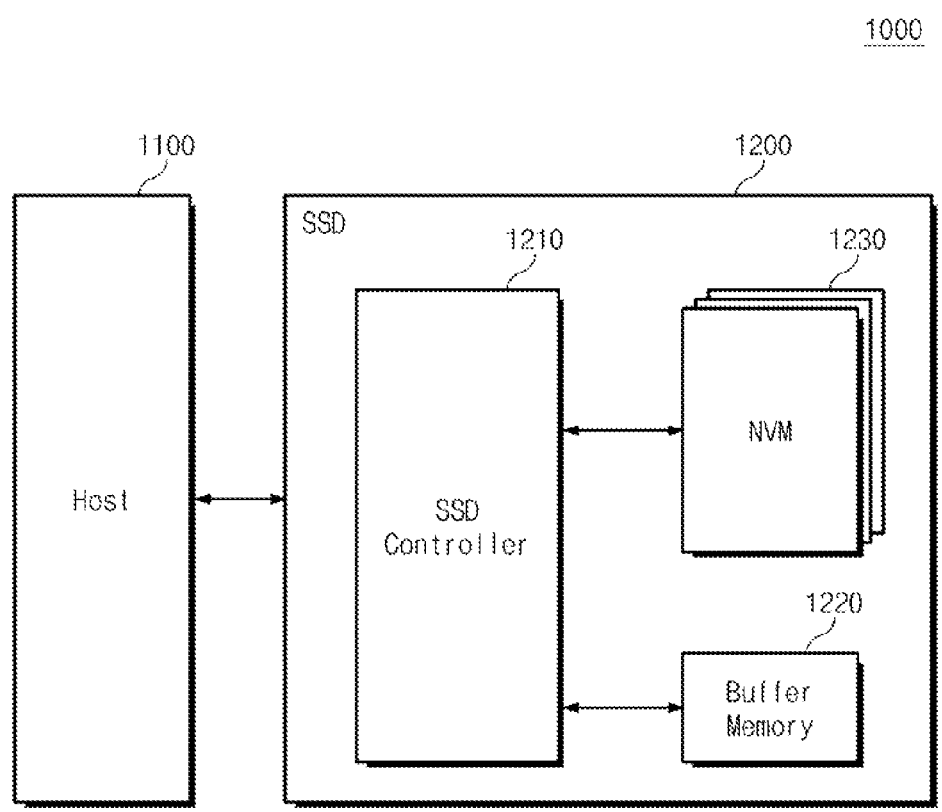
FIG. 13 is a block diagram of a user device including a solid state drive according to an embodiment of the inventive concept.

FIG. 13 is a block diagram of a user device including a solid state drive according to an embodiment of the inventive concept. Referring to FIG. 13, a user device 1000 includes a host 1100 and a solid state drive (hereinafter, referred to as SSD) 1200. The SSD 1200 may include an SSD controller 1210, a buffer memory 1220, and a nonvolatile memory device 1230.

The SSD controller 1210 provides physical interconnection between the host 1100 and the SSD 1200. The SSD controller 1210 provides an interface with the SSD 1200 corresponding to a bus format of the host 1100. In particular, the SSD controller 1210 decode a command provided from the host 1100, and accesses the nonvolatile memory device 1230 based on the decoding result. The bus format of the host 1100 may include a selection from among USB (Universal Serial Bus), SCSI (Small Computer System Interface), PCI express, ATA, PATA (Parallel ATA), SATA (Serial ATA), SAS (Serial Attached SCSI), and the like.

The buffer memory 1220 temporarily stores write data provided from the host 1100 or data read out from the nonvolatile memory device 1230. In the case that data existing in the nonvolatile memory device 1230 is cached, at a read request of the host 1100, the buffer memory 1220 may support a cache function to provide cached data directly to the host 1100. Typically, a data transfer speed of a bus format (e.g., SATA or SAS) of the host 1100 may be higher than that of a memory channel of the SSD 1200. Thus, in the event that the interface speed of the host 1100 is remarkably fast, lowering of the performance due to a speed difference may be minimized by providing the buffer memory 1220 having a large storage capacity.

The buffer memory 1220 may be formed of a synchronous DRAM to provide sufficient buffering to the SSD 1200 used as an auxiliary mass storage device. However, the buffer memory 1220 is not limited to this example.

The nonvolatile memory device 1230 is provided as a storage medium of the SSD 1200. The nonvolatile memory device 1230 may be formed of a NAND flash memory device having a large storage capacity. The nonvolatile memory device 1230 may be formed of a plurality of memory devices. In this case, the memory devices may be connected to the SSD controller 1210 by the channel, respectively. As a storage medium, the nonvolatile memory device 1230 may be formed of a NAND flash memory. However, the nonvolatile memory device 1230 is not limited to a NAND flash memory device. For example, a storage medium of the SSD 1200 can be formed of a PRAM, an MRAM, a ReRAM, a FRAM, a NOR flash memory, and the like. Further, the inventive concept may be applied to a memory system which uses different types of memory devices together. Each of the nonvolatile memory device 1230 includes a buffer region for a buffer-program operation and a main region for a main-program operation.

The SSD controller 1210 may perform pipeline programming, described with reference to FIG. 8B, with respect to a plurality of memory devices at a write operation. The SSD 1200 may provide a sufficient host accessible time to the host 1100 according to above described exemplary embodiments. In the case that a write manner of the inventive concept is used, the access-performance of the SSD 1200 may be improved without an increase in the capacity of the buffer memory 1220. In particular, the SSD 1200 may provide high write performance at a write operation on sequential data.

Figure 14:
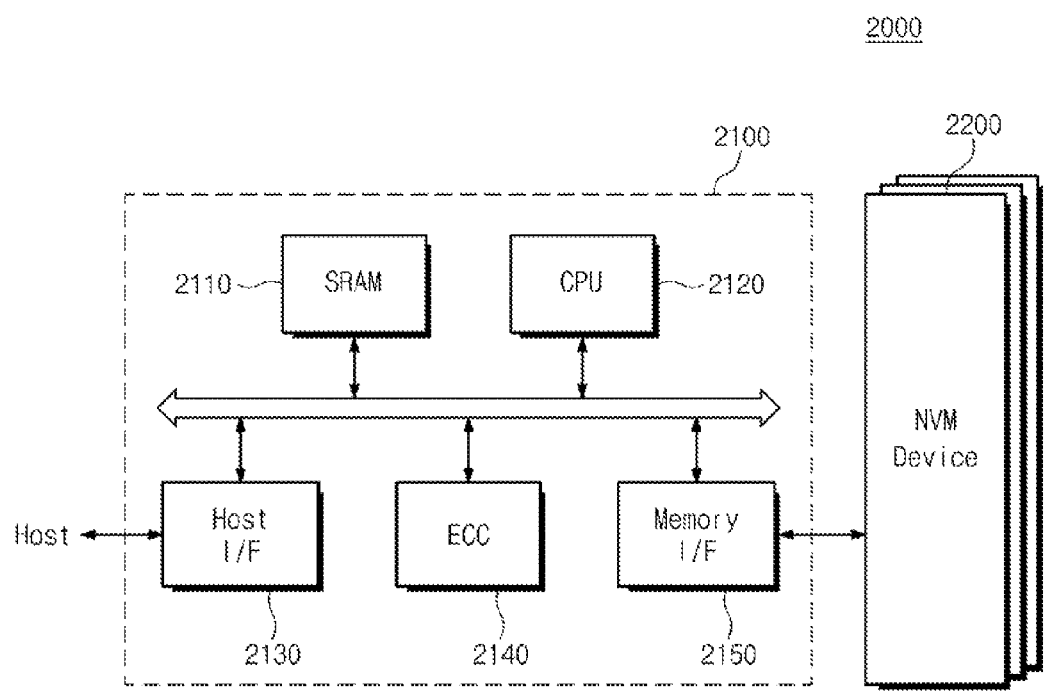
FIG. 14 is a block diagram of a memory system according to an embodiment of the inventive concept.

FIG. 14 is a block diagram of a memory system according to an embodiment of the inventive concept. Referring to FIG. 14, a memory system 2000 includes a memory controller 2100 and a nonvolatile memory device 2200.

The nonvolatile memory device 2200 may be configured the same or substantially the same as one of nonvolatile memory devices 200 and 320 in FIGS. 4 and 7, and a redundant description thereof is thus omitted.

The memory controller 2100 is configured to control the nonvolatile memory device 2200 to perform a write manner of the inventive concept. The memory controller 2100 and the nonvolatile memory device 2200 may form a memory card. An SRAM 2110 may be used as a working memory of a CPU 2120. Herein, the SRAM 2110 may include a lookup table in which an update frequency on each page data is stored. A host interface 2130 may include a data exchange protocol of a host connected with the memory system 2000. An ECC block 2140 may be configured to detect and correct errors included in data read out from the nonvolatile memory device 2200. A memory interface 2150 may interface with the nonvolatile memory device 2200 according to an embodiment of the inventive concept. The CPU 2210 executes an overall control operation for data exchange of the memory controller 2100. Although not shown in FIG. 14, the memory system 2000 may further include ROM which stores code data for interfacing with the host.

The memory controller 2100 may communicate with an external device (e.g., host) via one of interface protocols such as USB, MMC, PCI-E, SAS, SATA, PATA, SCSI, ESDI, IDE, and the like.

In exemplary embodiments, the memory system 2000 may be used as computer, portable computer, Ultra Mobile PC (UMPC), workstation, net-book, PDA, web tablet, wireless phone, mobile phone, smart phone, e-book, PMP (portable multimedia player), digital camera, digital audio recorder/player, digital picture/video recorder/player, portable game machine, navigation system, black box, 3-dimensional television, a device capable of transmitting and receiving information at a wireless circumstance, one of various electronic devices constituting home network, one of various electronic devices constituting computer network, one of various electronic devices constituting telematics network, RFID, or one of various electronic devices constituting a computing system.

The memory controller 2100 may perform pipeline programming, described with reference to FIG. 8B, with respect to a plurality of memory devices at a write operation. The memory system 2000 may thus provide a sufficient host accessible time to a host. The memory system 2000 may thus provide high write performance at a write operation on sequential data.

Figure 15:
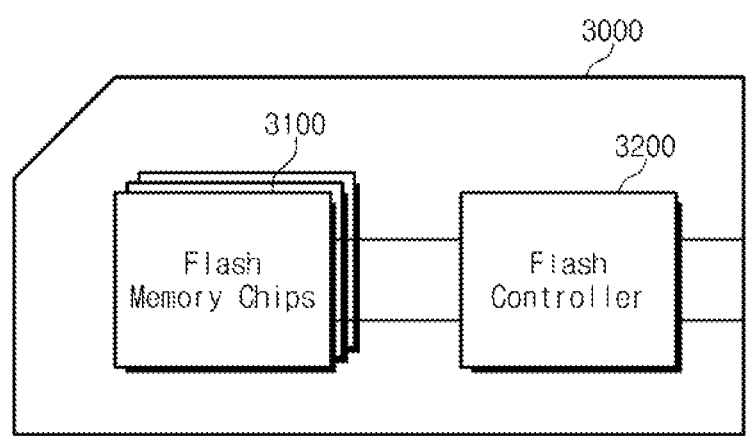
FIG. 15 is a block diagram illustrating a data storage device according to an embodiment of the inventive concept.

FIG. 15 is a block diagram of a data storage device according to an embodiment of the inventive concept. Referring to FIG. 15, a data storage device 3000 includes flash memory chips 3100 and a flash controller 3200. The flash controller 3200 controls the flash memory chips 3100 in response to control signals input from the outside of the data storage device 3000.

The flash memory chips 3100 may be configured the same or substantially the same as one of nonvolatile memory devices 200 and 320 in FIGS. 4 and 7, and may be formed of a multi-chip package. Each of the flash memory chips 3100 may be formed to have one of a stack flash structure in which arrays are stacked at multiple layers, a source-drain free flash structure, a pin-type flash structure, and a three-dimensional flash structure.

The data storage device 3000 may be a memory card device, an SSD device, a multimedia card device, an SD device, a memory stick device, a HDD device, a hybrid drive device, or an USB flash device. For example, the data storage device 3000 may be a card which satisfies a standard for using a user device such as a digital camera, a personal computer, and the like.

The flash controller 3200 may perform pipeline programming, described with reference to FIG. 8B, with respect to a plurality of memory devices at a write operation. The data storage device 3000 may thus provide a sufficient host accessible time to a host. The data storage device 3000 may thus provide high write performance at a write operation on sequential data.

Figure 16:
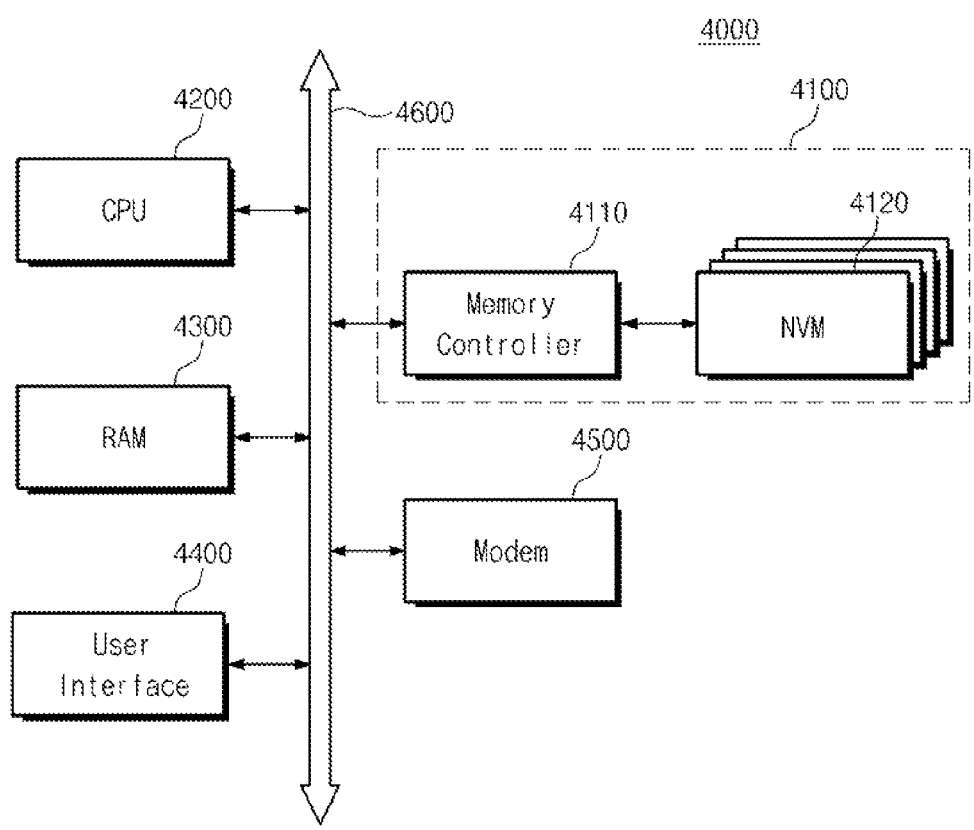
FIG. 16 is a block diagram of a computing system including a storage device according to an embodiment of the inventive concept.

FIG. 16 is a block diagram of a computing system including a storage device according to an embodiment of the inventive concept. The computing system 4000 includes a CPU 4200, a RAM 4300, a user interface 4400, a modem 4500 such as a baseband chipset, and a memory system 4100 which are electrically connected with a system bus 4600.

The memory system 4100 may be configured substantially the same as one of storage devices 200 and 300 in FIGS. 4 and 7. A flash memory of the inventive concept may be formed to have one of a stack flash structure in which arrays are stacked at multiple layers, a source-drain free flash structure, a pin-type flash structure, and a three-dimensional flash structure.

If the computing system 4000 is a mobile device, it may further include a battery (not shown) which powers the computing system 4000. Although not shown in FIG. 16, the computing system 4000 may further include an application chipset, a camera image processor (CIS), a mobile DRAM, and the like. A memory controller 4110 and a flash memory device 4120 may be a solid state drive/disk (SSD) which uses a nonvolatile memory to store data, for example.

Figure 17:
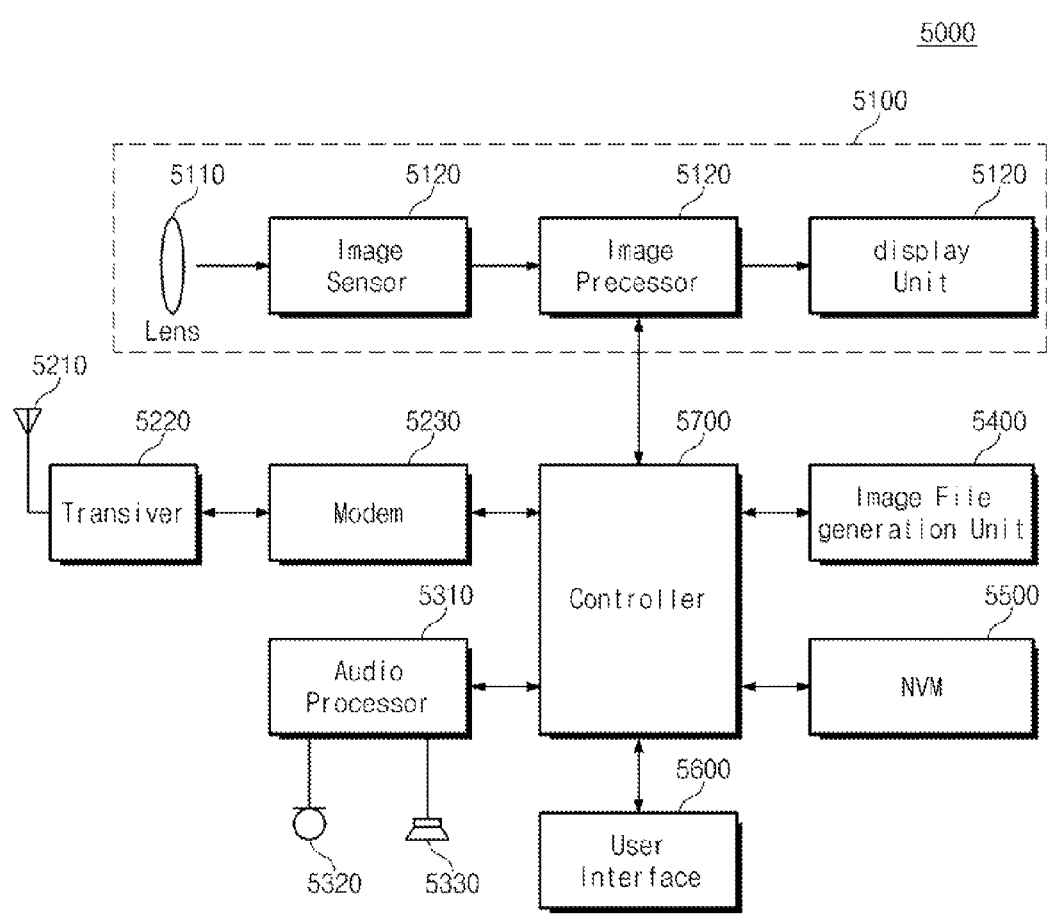
FIG. 17 is a block diagram of a handheld terminal according to an embodiment of the inventive concept.

FIG. 17 is a block diagram of a handheld terminal according to an embodiment of the inventive concept. Referring to FIG. 17, a handheld terminal 5000 includes an image processing unit 5100, a wireless transceiver unit 5200, an audio processing unit 5300, an image file generation unit 5400, a memory 5500, a user interface 5600, and a controller 5700.

The image processing unit 5100 includes a lens 5110, an image sensor 5120, an image processor 5130, and a display unit 5140. The wireless transceiver unit 5200 includes an antenna 5210, a transceiver 5220, and a modem 5230. The audio processing unit 5300 includes an audio processor 5310, a microphone 5320, and a speaker 5330.

The image processing unit 5100 processes image data using a memory according to at least one of above described embodiments of the inventive concept. The image processor 5130 may secure a margin of a channel bandwidth by pre-processing image data provided from the image sensor 5120 before input to a codec.

Herein, the memory 5300 may be a multi-chip nonvolatile memory device driven according to an embodiment of the inventive concept. In this case, the memory 5500 may provide high write performance to response within a timeout period.

A nonvolatile memory device and/or a memory controller may be packaged as one selected from various types of packages such as PoP (Package on Package), Ball grid arrays (BGAs), Chip scale packages (CSPs), Plastic Leaded Chip Carrier (PLCC), Plastic Dual In-Line Package (PDI2P), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and so on.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A data storage device, comprising:
a plurality of memory chips each nonvolatile memory cells divided into a first memory region and a second memory region; and
a memory controller configured to buffer data provided from the exterior and configured to control the plurality of memory chips to perform a buffer-program operation and a main-program operation,
wherein the buffered data is copied from the memory controller to the first memory region using the buffer-program operation and data stored in the first memory region is copied from the first memory region to the second memory region using the main-program operation, and
wherein during a main-program operation of a first memory chip of the plurality of memory chips, the memory controller buffers data and programs the buffered data into a second memory chip of the plurality of memory chips according to the buffer-program operation.

2. The data storage device of claim 1, wherein the first memory region is formed of single level cells and the second memory region is formed of multi-level cells.

3. The data storage device of claim 1, wherein during the main-program operation of the first memory chip, a plurality of pages stored in the first memory region is written into the second memory region through a plurality of steps, and the plurality of pages is simultaneously programmed at each step.

4. The data storage device of claim 3, wherein each of the plurality of steps is subdivided into reading the plurality of pages from the first memory region and programming the plurality of pages into the second memory region.

5. The data storage device of claim 4, wherein during a period the first memory chip performs the programming of the plurality of pages into the second memory region, the memory controller controls the second chip to perform buffering of data to be written into the second memory chip and perform the buffer-program operation on the buffered data.

6. The data storage device of claim 1, wherein the memory controller comprises a buffer memory which buffers data provided from the exterior.

7. The data storage device of claim 1, wherein the plurality of memory chips is connected to the memory controller through a plurality of channels.

8. The data storage device of claim 7, wherein the first and second memory chips are connected to the same channel.

9. The data storage device of claim 1, wherein the main-program operation corresponds to a plurality of steps, the number of bits programmed in each of the plurality of steps is the same.

10. A method of operating a data storage device that includes a plurality of nonvolatile memory chips each chip having a buffer region comprising first memory blocks managed in a single level cell manner and a main region comprising second memory blocks managed in a multi-level cell manner, comprising:
receiving first data from the exterior;
storing the first data into a RAM buffer memory;
receiving second data from the exterior;
storing the second data into the RAM buffer memory;
performing a buffer-program operation in which the first data stored in the RAM buffer memory is copied from the RAM buffer memory to the buffer region of a first nonvolatile memory chip among the plurality of nonvolatile memory chips;
performing a buffer-program operation in which the second data stored in the RAM buffer memory is copied from the RAM buffer memory to the buffer region of a second nonvolatile memory chip among the plurality of nonvolatile memory chips; and
performing a main-program operation wherein the buffered second data stored in the buffer region of the second nonvolatile memory chip is copied from the buffer region to the main region of the second nonvolatile memory chip,
wherein the storing of the first data into the RAM buffer memory and the buffer-program operation of the first memory chip are overlapped by the main-program operation of the second memory chip.

11. The method of claim 10, wherein the first data provided from the exterior is buffered in the RAM buffer memory and then buffer-programmed into the buffer region of the first nonvolatile memory chip by a page unit.

12. The method of claim 10, wherein the main-program operation includes a plurality of programming steps for programming the plurality of pages in the main region of the second chip and wherein the storing and the buffer-program operation of the first chip is overlapped by one of the plurality of programming steps of the main-program operation of the second chip.

13. The method of claim 12, wherein the storing and the buffer-program operation of the first chip is overlapped by programming the second data into the main region of the second nonvolatile memory chip.

14. The method of claim 12, wherein each of the plurality of programming steps of the second chip comprises:
providing a command such that the buffered second data is read from the buffer region of the second chip; and
providing a command such that the buffered second data is programmed into the plurality of pages into the main region of the second chip.

15. A data storage device, comprising:
a plurality of memory chips each memory chip including a first memory region and a second memory region; and
a memory controller configured to buffer data provided from the exterior and configured to control the plurality of memory chips to perform a buffer-program operation and a main-program operation, wherein the buffered data is copied from the memory controller to the first memory region using the buffer-program operation and data stored in the first memory region is copied from the first memory region to the second memory region using the main-program operation,
wherein the memory controller performs buffering of data provided from the exterior and controls a first one of the plurality of memory chips to perform the buffer-program operation on the buffered data while a second other one of the plurality of memory chips performs the main-program operation.

16. The data storage device of claim 15, wherein the first memory region is formed of m-bit multi-level cells and the second memory region is formed of n-bit multi-level cells, wherein n is larger than m.

17. The data storage device of claim 15, wherein the main-program operation includes a plurality of steps, each step is subdivided into reading a plurality of pages from the first memory region and programming the plurality of pages into the second memory region,
wherein the buffering and the buffer-program operation of the first memory chip are overlapped by programming the plurality of pages into the second region by the second memory chip.

18. The data storage device of claim 15, wherein the memory controller comprises a buffer memory which buffers data provided from the exterior.

19. The data storage device of claim 15, wherein the main program operation corresponds to a plurality of steps, the number of bits programmed in each of the plurality of steps is the same.

20. The data storage device of claim 15, wherein the main program operation corresponds to a plurality of steps, the number of bits programmed in at least one of the plurality of steps is different from the number of bits programmed in each of the remaining steps.

* * * * *